(12) United States Patent
Sasaki et al.

(10) Patent No.: US 10,418,467 B2
(45) Date of Patent: Sep. 17, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Toshinari Sasaki, Atsugi (JP); Junichiro Sakata, Atsugi (JP); Hiroki Ohara, Sagamihara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/953,795

(22) Filed: Apr. 16, 2018

(65) Prior Publication Data

US 2018/0233589 A1    Aug. 16, 2018

Related U.S. Application Data

(63) Continuation of application No. 15/193,827, filed on Jun. 27, 2016, now Pat. No. 9,985,118, which is a (Continued)

(30) Foreign Application Priority Data

Jun. 30, 2009    (JP) ................. 2009-156414

(51) Int. Cl.
*H01L 29/24*    (2006.01)
*H01L 29/66*    (2006.01)
(Continued)

(52) U.S. Cl.
CPC ...... *H01L 29/66969* (2013.01); *H01L 27/124* (2013.01); *H01L 27/1225* (2013.01);
(Continued)

(58) Field of Classification Search
CPC ............ H01L 29/66969; H01L 27/124; H01L 29/78696; H01L 29/42356; H01L 29/24;
(Continued)

(56) References Cited

U.S. PATENT DOCUMENTS 4,938,567 A    7/1990    Chartier
5,731,856 A    3/1998    Kim et al.
(Continued)

FOREIGN PATENT DOCUMENTS

CN    001638170 A    7/2005
EP    1501122 A    1/2005
(Continued)

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.
(Continued)

*Primary Examiner* — Kyoung Lee
(74) *Attorney, Agent, or Firm* — Robinson Intellectual Property Law Office; Eric J. Robinson

(57) ABSTRACT

It is an object to provide a highly reliable semiconductor device which includes a thin film transistor having stable electric characteristics. It is another object to manufacture a highly reliable semiconductor device at lower cost with high productivity. In a method for manufacturing a semiconductor device which includes a thin film transistor where a semiconductor layer having a channel formation region, a source region, and a drain region are formed using an oxide semiconductor layer, heat treatment (heat treatment for dehydration or dehydrogenation) is performed so as to improve the purity of the oxide semiconductor layer and reduce impurities such as moisture. Moreover, the oxide
(Continued)

semiconductor layer subjected to the heat treatment is slowly cooled under an oxygen atmosphere.

13 Claims, 34 Drawing Sheets
(2 of 34 Drawing Sheet(s) Filed in Color)

Related U.S. Application Data continuation of application No. 15/057,445, filed on Mar. 1, 2016, now Pat. No. 9,412,768, which is a continuation of application No. 14/867,636, filed on Sep. 28, 2015, now Pat. No. 9,299,807, which is a continuation of application No. 14/247,665, filed on Apr. 8, 2014, now Pat. No. 9,293,566, which is a continuation of application No. 13/967,605, filed on Aug. 15, 2013, now Pat. No. 8,697,488, which is a continuation of application No. 13/767,335, filed on Feb. 14, 2013, now Pat. No. 8,513,054, which is a continuation of application No. 13/495,481, filed on Jun. 13, 2012, now Pat. No. 8,394,671, which is a continuation of application No. 12/826,015, filed on Jun. 29, 2010, now Pat. No. 8,216,878.

(51) Int. Cl.
*H01L 27/12* (2006.01)
*H01L 29/786* (2006.01)
*H01L 29/423* (2006.01)

(52) U.S. Cl.
CPC ........ *H01L 29/24* (2013.01); *H01L 29/42356* (2013.01); *H01L 29/42384* (2013.01); *H01L 29/66742* (2013.01); *H01L 29/7869* (2013.01); *H01L 29/78606* (2013.01); *H01L 29/78618* (2013.01); *H01L 29/78696* (2013.01)

(58) Field of Classification Search
CPC ......... H01L 29/42384; H01L 29/78606; H01L 29/78618; H01L 29/66742; H01L 29/7869; H01L 27/1225
See application file for complete search history.

(56) References Cited

U.S. PATENT DOCUMENTS

| | | | |
|---|---|---|---|
| 5,744,864 A | 4/1998 | Cillessen et al. |
| 5,917,198 A | 6/1999 | Maeda |
| 6,051,453 A | 4/2000 | Takemura |
| 6,294,274 B1 | 9/2001 | Kawazoe et al. |
| 6,297,122 B1 | 10/2001 | Eguchi et al. |
| 6,310,362 B1 | 10/2001 | Takemura |
| 6,534,832 B2 | 3/2003 | Takemura |
| 6,563,174 B2 | 5/2003 | Kawasaki et al. |
| 6,649,434 B2 | 11/2003 | Iwata et al. |
| 6,680,242 B2 | 1/2004 | Ohtsu et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,255,899 B2 | 8/2007 | Kusuda |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,382,421 B2 | 6/2008 | Hoffman et al. |
| 7,385,224 B2 | 6/2008 | Ishii et al. |
| 7,397,110 B2 | 7/2008 | Takase et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,541,614 B2 | 6/2009 | Kato |
| 7,564,058 B2 | 7/2009 | Yamazaki et al. |
| 7,579,224 B2 | 8/2009 | Kuwabara et al. |
| 7,601,984 B2 | 10/2009 | Sano et al. |
| 7,659,138 B2 | 2/2010 | Hirakata et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,858,985 B2 | 12/2010 | Kato |
| 7,884,360 B2 | 2/2011 | Takechi et al. |
| 7,893,431 B2 | 2/2011 | Kim et al. |
| 7,935,582 B2 | 5/2011 | Iwasaki |
| 7,956,361 B2 | 6/2011 | Iwasaki |
| 7,977,150 B2 | 7/2011 | Hirakata et al. |
| 8,049,219 B2 | 11/2011 | Kato |
| 8,143,678 B2 | 3/2012 | Kim et al. |
| 8,154,024 B2 | 4/2012 | Iwasaki |
| 8,193,031 B2 | 6/2012 | Hosoba et al. |
| 8,193,045 B2 | 6/2012 | Omura et al. |
| 8,202,760 B2 | 6/2012 | Hirakata et al. |
| 8,207,014 B2 | 6/2012 | Sasaki et al. |
| 8,258,023 B2 | 9/2012 | Lee |
| 8,304,298 B2 | 11/2012 | Ofuji et al. |
| 8,354,674 B2 | 1/2013 | Kimura |
| 8,384,077 B2 | 2/2013 | Yano et al. |
| 8,389,326 B2 | 3/2013 | Sasaki et al. |
| 8,415,198 B2 | 4/2013 | Itagaki et al. |
| 8,421,070 B2 | 4/2013 | Kim et al. |
| 8,469,703 B2 | 6/2013 | Kobayashi |
| 8,647,933 B2 | 2/2014 | Yamazaki |
| 9,082,857 B2 | 7/2015 | Yamazaki et al. |
| 9,397,194 B2 | 7/2016 | Yamazaki et al. |
| 9,412,768 B2 | 8/2016 | Sasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218215 A1 | 11/2003 | Takemura |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0027804 A1 | 2/2006 | Yamazaki et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113541 A1 | 6/2006 | Takemura |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0085075 A1 | 4/2007 | Yamazaki et al. |
| 2007/0090365 A1 | 4/2007 | Hayashi et al. |

(56) References Cited

U.S. PATENT DOCUMENTS

| | | |
|---|---|---|
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0207574 A1 | 9/2007 | Wang et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023698 A1 | 1/2008 | Li et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0119030 A1 | 5/2008 | Kunii |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277656 A1 | 11/2008 | Park et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0318368 A1 | 12/2008 | Ryu et al. |
| 2009/0001881 A1 | 1/2009 | Nakayama |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153762 A1 | 6/2009 | Kuwabara et al. |
| 2009/0194769 A1 | 8/2009 | Hiramatsu et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0006833 A1 | 1/2010 | Ha et al. |
| 2010/0012932 A1 | 1/2010 | Shieh et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0148169 A1 | 6/2010 | Kim et al. |
| 2010/0155717 A1 | 6/2010 | Yano et al. |
| 2010/0171117 A1 | 7/2010 | Kuwabara et al. |
| 2010/0175755 A1 | 7/2010 | Singh et al. |
| 2010/0193785 A1 | 8/2010 | Kimura |
| 2010/0203673 A1 | 8/2010 | Hayashi et al. |
| 2010/0213459 A1 | 8/2010 | Shimada et al. |
| 2010/0252832 A1 | 10/2010 | Asano et al. |
| 2010/0264412 A1* | 10/2010 | Yamazaki .............. H01L 27/12 257/43 |
| 2011/0003418 A1 | 1/2011 | Sakata et al. |
| 2011/0003427 A1 | 1/2011 | Sasaki et al. |
| 2011/0003429 A1 | 1/2011 | Oikawa et al. |
| 2011/0003430 A1 | 1/2011 | Yamazaki et al. |
| 2011/0006302 A1 | 1/2011 | Yamazaki et al. |
| 2011/0008930 A1 | 1/2011 | Sasaki et al. |
| 2011/0042669 A1 | 2/2011 | Kim et al. |
| 2011/0053322 A1 | 3/2011 | Sasaki et al. |
| 2011/0097844 A1 | 4/2011 | Takechi et al. |
| 2011/0101342 A1 | 5/2011 | Kim et al. |
| 2012/0126226 A1 | 5/2012 | Kuwabara et al. |
| 2012/0132911 A1 | 5/2012 | Shimada et al. |
| 2012/0220078 A1 | 8/2012 | Hosoba et al. |
| 2012/0319103 A1 | 12/2012 | Lee |
| 2013/0146452 A1 | 6/2013 | Yano et al. |
| 2016/0268437 A1 | 9/2016 | Yamazaki et al. |

FOREIGN PATENT DOCUMENTS

| | | |
|---|---|---|
| EP | 1624333 A | 2/2006 |
| EP | 1737044 A | 12/2006 |
| EP | 2159845 A | 3/2010 |
| EP | 2184783 A | 5/2010 |
| EP | 2226847 A | 9/2010 |
| EP | 2339639 A | 6/2011 |
| JP | 60-198861 A | 10/1985 |
| JP | 63-208896 A | 8/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-501100 | 4/1989 |
| JP | 02-156676 A | 6/1990 |
| JP | 05-251705 A | 9/1993 |
| JP | 06-069919 B | 9/1994 |
| JP | 08-160451 A | 6/1996 |
| JP | 08-264794 A | 10/1996 |
| JP | 08-330647 A | 12/1996 |
| JP | 09-266179 A | 10/1997 |
| JP | 11-505377 | 5/1999 |
| JP | 2000-044236 A | 2/2000 |
| JP | 2000-150900 A | 5/2000 |
| JP | 2000-173945 A | 6/2000 |
| JP | 2000-357586 A | 12/2000 |
| JP | 2002-076356 A | 3/2002 |
| JP | 2002-093822 A | 3/2002 |
| JP | 2002-289859 A | 10/2002 |
| JP | 2002-319321 A | 10/2002 |
| JP | 2003-086000 A | 3/2003 |
| JP | 2003-086808 A | 3/2003 |
| JP | 2003-209054 A | 7/2003 |
| JP | 2004-103957 A | 4/2004 |
| JP | 2004-214616 A | 7/2004 |
| JP | 2004-273614 A | 9/2004 |
| JP | 2004-273732 A | 9/2004 |
| JP | 2004-297048 A | 10/2004 |
| JP | 2005-285890 A | 10/2005 |
| JP | 2006-080494 A | 3/2006 |
| JP | 2006-128654 A | 5/2006 |
| JP | 2006-165527 A | 6/2006 |
| JP | 2006-229212 A | 8/2006 |
| JP | 2007-041260 A | 2/2007 |
| JP | 2007-073558 A | 3/2007 |
| JP | 2007-096055 A | 4/2007 |
| JP | 2007-103918 A | 4/2007 |
| JP | 2007-123861 A | 5/2007 |
| JP | 2007-150158 A | 6/2007 |
| JP | 2007-235153 A | 9/2007 |
| JP | 2008-042088 A | 2/2008 |
| JP | 2008-053356 A | 3/2008 |
| JP | 2008-124408 A | 5/2008 |
| JP | 2008-130838 A | 6/2008 |
| JP | 2008-172244 A | 7/2008 |
| JP | 2008-199005 A | 8/2008 |

(56) References Cited

FOREIGN PATENT DOCUMENTS

| | | | |
|---|---|---|---|
| JP | 2008-243928 A | 10/2008 | |
| JP | 2008-281988 A | 11/2008 | |
| JP | 2008-282913 A | 11/2008 | |
| JP | 2009-004733 A | 1/2009 | |
| JP | 2009-010362 A | 1/2009 | |
| JP | 2009-031750 A | 2/2009 | |
| JP | 2009-033145 A | 2/2009 | |
| JP | 2009-099847 A | 5/2009 | |
| JP | 2009-099944 A | 5/2009 | |
| JP | 2009-128761 A | 6/2009 | |
| JP | 2010-062229 A | 3/2010 | |
| JP | 2010-080952 A | 4/2010 | |
| JP | 2010-135774 A | 6/2010 | |
| KR | 10-0366372 | 12/2002 | |
| KR | 2008-0106049 A | 12/2008 | |
| TW | I295855 | 4/2008 | |
| WO | WO-2004/114391 | 12/2004 | |
| WO | WO-2007/029844 | 3/2007 | |
| WO | WO-2007/120010 | 10/2007 | |
| WO | WO-2008/023553 | 2/2008 | |
| WO | WO-2008/126879 | 10/2008 | |
| WO | WO-2008/133456 | 11/2008 | |
| WO | WO-2008/143304 | 11/2008 | |
| WO | WO-2008/149873 | 12/2008 | |
| WO | WO-2009/034953 | 3/2009 | |
| WO | WO-2009/041544 | 4/2009 | |
| WO | WO-2009/041713 | 4/2009 | |
| WO | WO-2009/075281 | 6/2009 | |

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

International Search Report (Application No. PCT/JP2010/060699) dated Jul. 27, 2010.

Written Opinion (Application No. PCT/JP2010/060699) dated Jul. 27, 2010.

Fortunato.E et al., "Wide-Bandgap High-Mobility ZnO Thin-Film Transistors Produced at Room Temperature"Appl. Phys. Lett. (Applied Physics Letters), Sep. 27, 2004, vol. 85, No. 13, pp. 1067-1069.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '06 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Kanno.H et al., "White Stacked Electrophosphorecent Organic Light-Emitting Devices Employin MOO3 as a Charge-Generation Layer", Adv. Mater. (Advanced Materials), 2006, vol. 18, No. 3, pp 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09: Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31. 2009, pp. 1110-1112,
Ohara.H et al., "21.3:4.0 In. QVGA AMOLED Display Using In—Ga—Zn-Oxide TFTS With a Novel Passivatlon Layer", SID Digest '09: SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7. pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.
Lee.H et al., "Current Status of, Challenges to, and Perspective View of AM-OLED", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "SPINEL,YBFE2O4, and YB2FE3O7 Types of Structures for Compounds in the IN2O3 AND SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 2 SID International Symposium Digest of Technical Papers, May 20, 2008, vol. 39. pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 31, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08: Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.
Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.
Chinese Office Action (Application No. 201080029505.0) dated Jan. 13, 2014.
Korean Office Action (Application No. 2015-7016017) dated Oct. 15, 2015.
Korean Office Action (Application No. 2016-7020272) dated Aug. 9, 2016.

(56) References Cited

OTHER PUBLICATIONS

Chinese Office Action (Application No. 201410555144.3) dated Mar. 13, 2017.

* cited by examiner

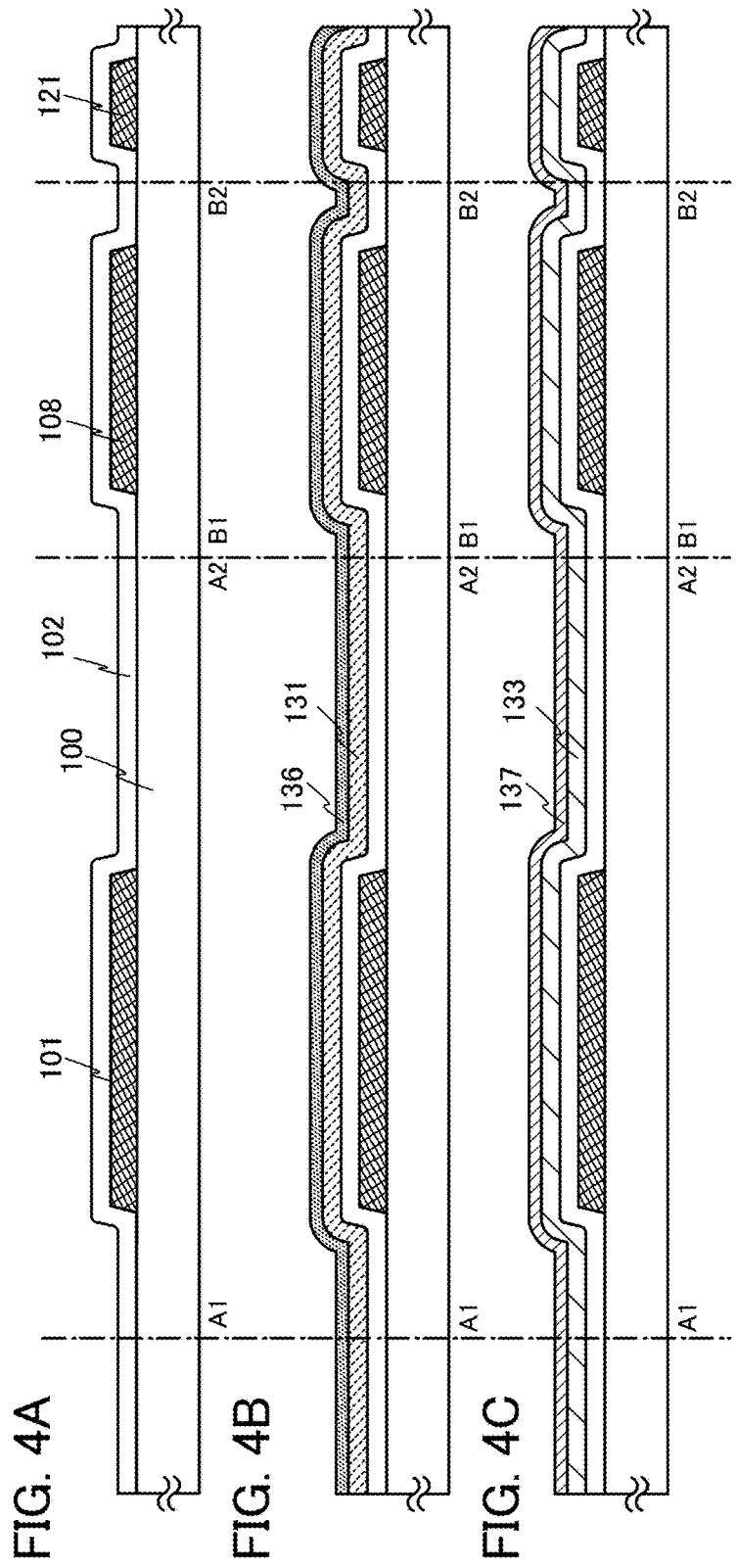

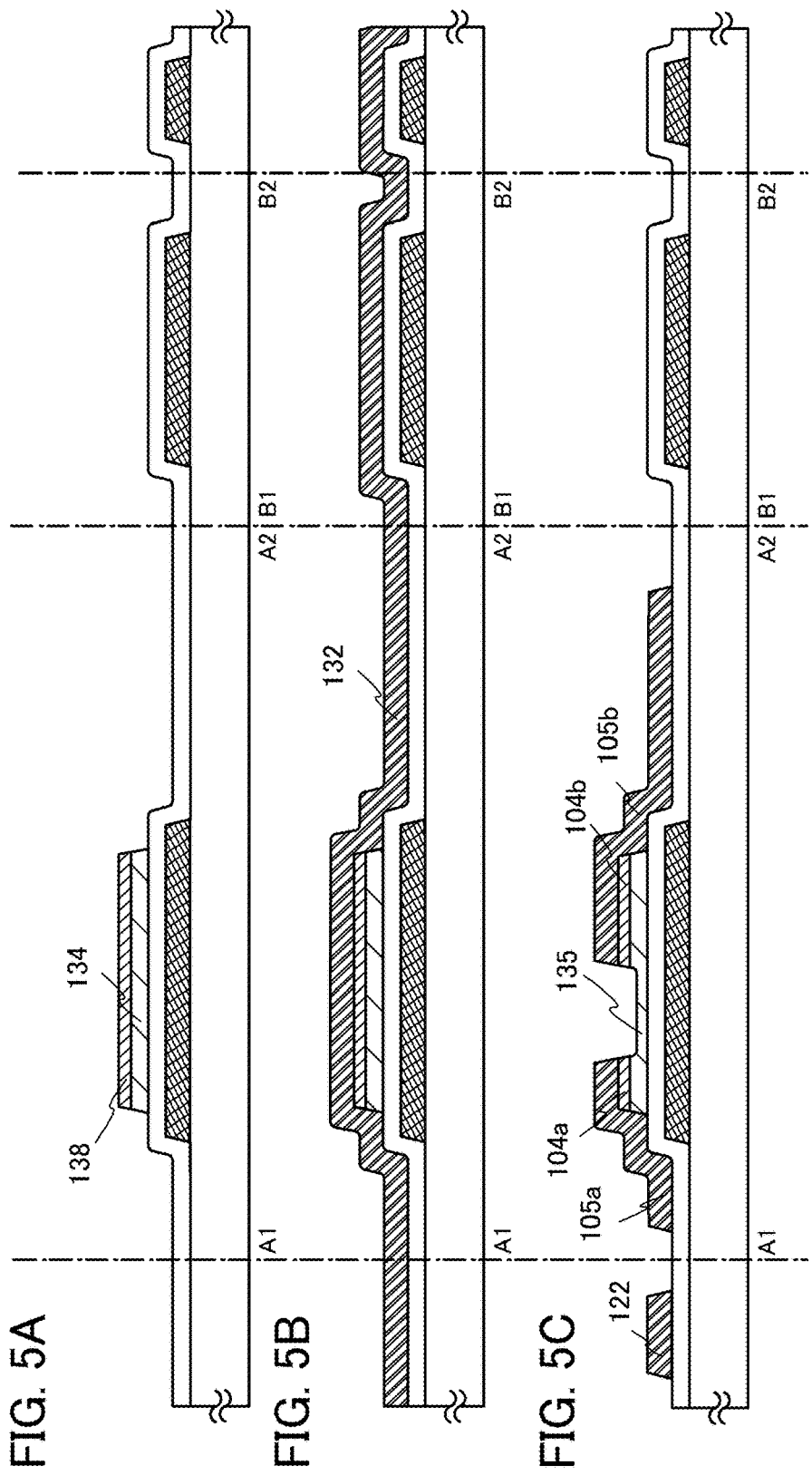

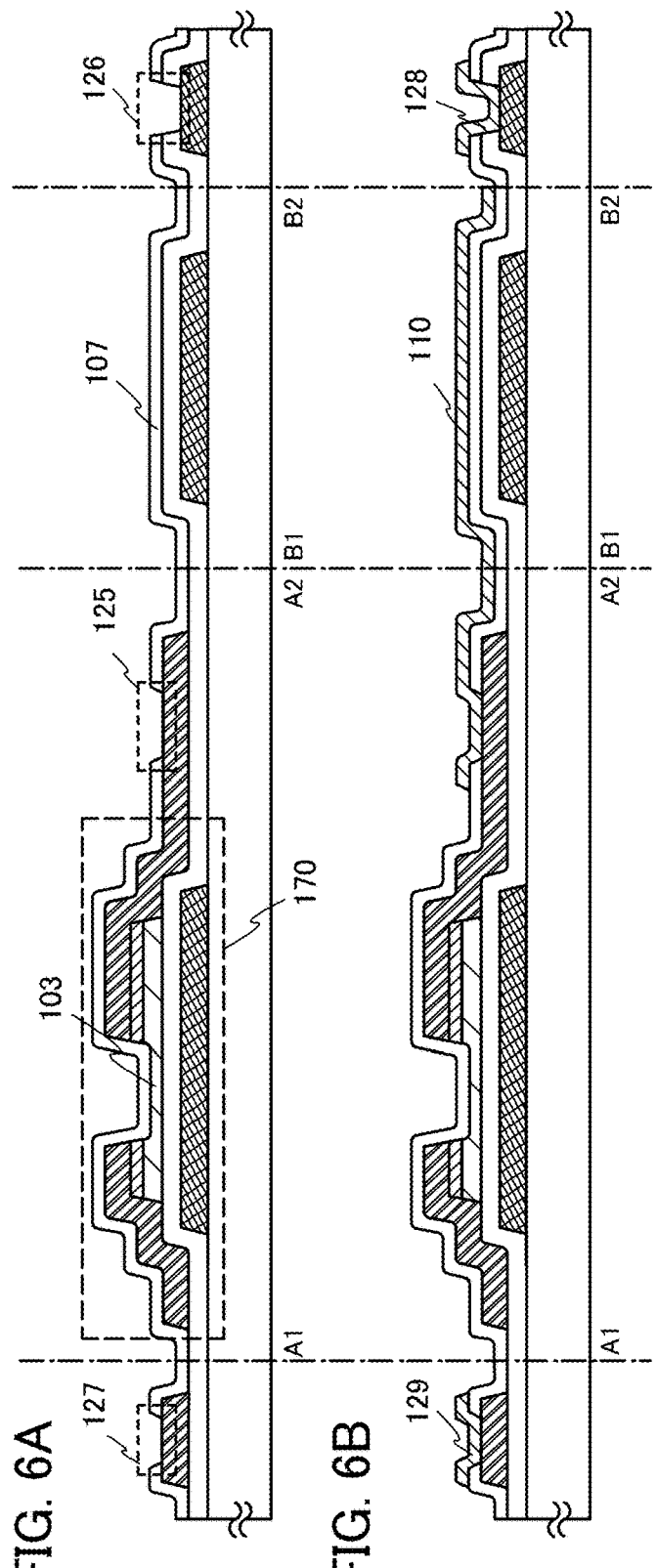

FIG. 8A1 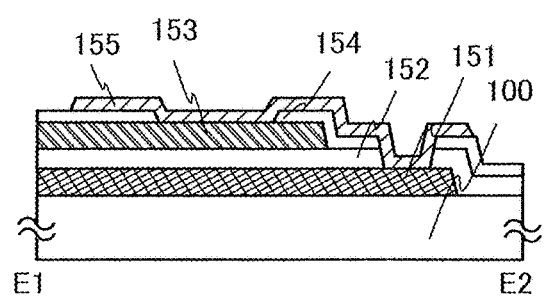
FIG. 8A2 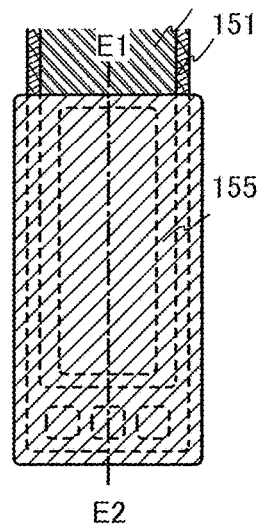
FIG. 8B1 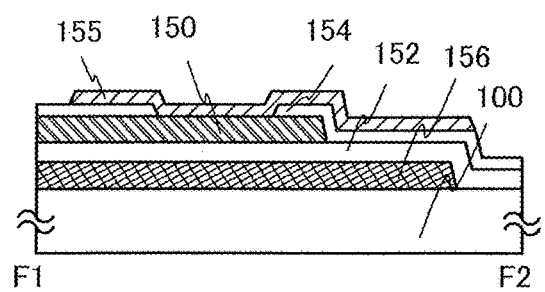
FIG. 8B2 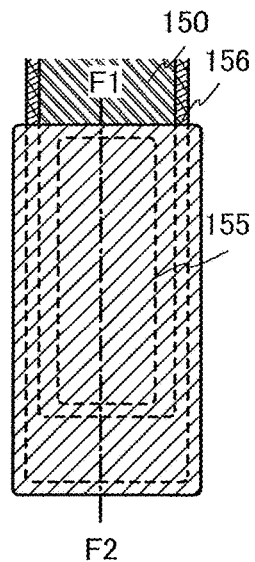

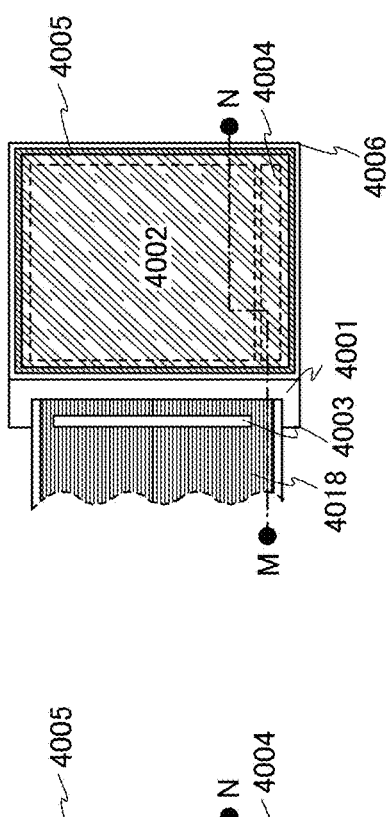
FIG. 10A1
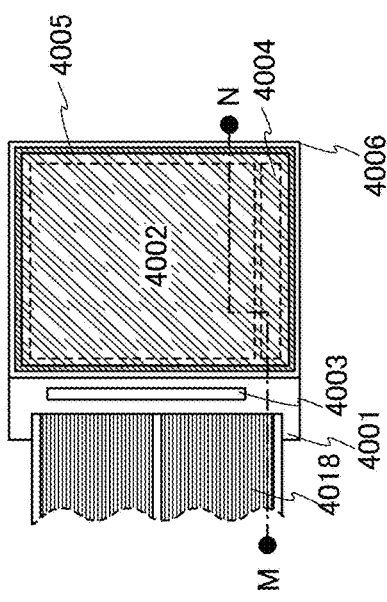
FIG. 10A2
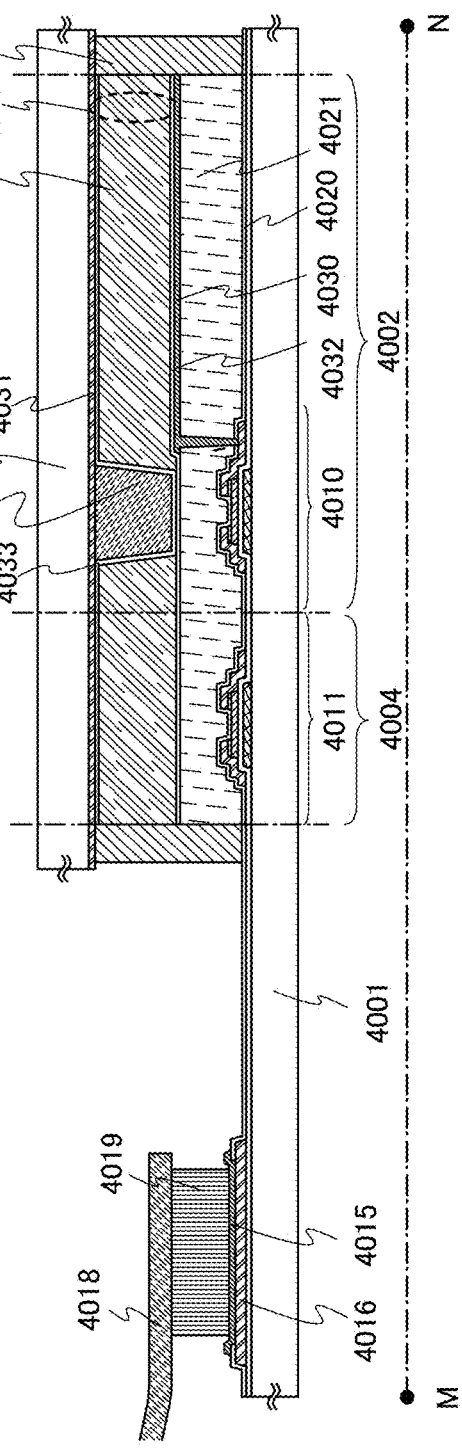
FIG. 10B

METHOD FOR MANUFACTURING SEMICONDUCTOR DEVICE

TECHNICAL FIELD

The present invention relates to a method for manufacturing a semiconductor device including an oxide semiconductor.

BACKGROUND ART

In recent years, a technique by which a thin film transistor (TFT) is manufactured using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices and urgently developed particularly as switching elements in image display devices.

Various metal oxides are used for a variety of applications. Indium oxide is a well-known material and is used as a transparent electrode material which is necessary for liquid crystal displays and the like.

Some metal oxides have semiconductor characteristics. For example, metal oxides having semiconductor characteristics include tungsten oxide, tin oxide, indium oxide, zinc oxide, and the like, and thin film transistors in each of which a channel formation region is formed using such a metal oxide having semiconductor characteristics are already known (see Patent Documents 1 to 4, and Non-Patent Document 1).

Further, not only single-component oxides but also multi-component oxides are known as metal oxides. For example, $InGaO_3(ZnO)_m$ (m: natural number) having a homologous series is known as a multi-component oxide semiconductor including In, Ga, and Zn (see Non-Patent Documents 2 to 4).

Further, it is confirmed that an oxide semiconductor including an In—Ga—Zn-based oxide as described above is applicable to a channel layer of a thin film transistor (see Patent Document 5, and Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides $(InFeO3(ZnO)_m)$ (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

DISCLOSURE OF INVENTION

It is an object to manufacture and provide a highly reliable semiconductor device including a thin film transistor having stable electric characteristics.

In a method for manufacturing a semiconductor device which includes a thin film transistor where a semiconductor layer including a channel formation region and source and drain regions are formed using an oxide semiconductor layer, heat treatment (heat treatment for dehydration or dehydrogenation) is performed so as to improve the purity of the oxide semiconductor layer and reduce impurities such as moisture. In addition, not only impurities such as moisture in the oxide semiconductor layer but also those existing in a gate insulating layer are reduced, and impurities such as moisture existing in interfaces between the oxide semiconductor layer and films provided over and under and in contact with the oxide semiconductor layer are reduced.

In this specification, an oxide semiconductor film which is used for a semiconductor layer including a channel formation region is referred to as a first oxide semiconductor film (a first oxide semiconductor layer), and an oxide semiconductor film which is used for source and drain regions is referred to as a second oxide semiconductor film (a second oxide semiconductor layer).

In order to reduce impurities such as moisture, the first oxide semiconductor film and the second oxide semiconductor film are formed and then subjected to heat treatment at 200° C. or higher, preferably higher than or equal to 400° C. and lower than or equal to 600° C., under an inert gas atmosphere of nitrogen or a rare gas (such as argon or helium) or under reduced pressure, with the first oxide semiconductor film and the second oxide semiconductor film exposed. Thus, moisture included in the first oxide semiconductor film and the second oxide semiconductor film is reduced. After the heating, the oxide semiconductor films are slowly cooled in the range of higher than or equal to room temperature and lower than 100° C. under an oxygen atmosphere.

With the use of the first oxide semiconductor film and the second oxide semiconductor film in which moisture is reduced by heat treatment under an inert gas atmosphere of nitrogen or argon or under reduced pressure, electric characteristics of a thin film transistor is improved and a thin film transistor having both high productivity and high performance is realized.

FIG. 29 shows results of performing thermal desorption spectroscopy (TDS) measurement using a thermal desorption spectrometer on a plurality of samples on which heat treatment was performed under a nitrogen atmosphere under different heating-temperature conditions.

The thermal desorption spectrometer is an apparatus for detecting and identifying, using a quadrupole mass spectrometer, a gas component which is discharged or generated from a sample when the sample is heated and the temperature thereof is increased in high vacuum. With the thermal desorption spectroscopy, a gas and a molecule discharged from a surface or the inside of a sample can be observed. A thermal desorption spectrometer manufactured by ESCO, Ltd. (product name: EMD-WA1000S) was used. As for the measurement condition, the rate of temperature rise was set at approximately 10° C./min, the SEM voltage was set to 1500 V, the dwell time was 0.2 (sec), and the number of channels to be used was 23. In addition, during the measurement, the pressure was at a degree of vacuum of approximately $1 \times 10^{-7}$ (Pa). Note that the ionization coefficient, the fragmentation coefficient, the pass-through coefficient, and the pumping rate of $H_2O$ were respectively 1.0, 0.805, 1.56, and 1.0.

FIG. 29 is a graph showing results of TDS measurement in terms of $H_2O$, where the following samples are compared: a sample (sample 1) in which an In—Ga—Zn—O-based non-single-crystal film was formed to a thickness of 50 nm over a glass substrate; a sample (sample 4) on which heat treatment was performed at 250° C. for 1 hour under a nitrogen atmosphere; a sample (sample 3) on which heat treatment was performed at 350° C. for 1 hour under a nitrogen atmosphere; a sample (sample 5) on which heat treatment was performed at 450° C. for 1 hour under a nitrogen atmosphere; and a sample (sample 6) on which heat treatment was performed at 350° C. for 10 hours under a nitrogen atmosphere. The results in FIG. 29 indicate that the higher the heating temperature under a nitrogen atmosphere is, the more impurities such as moisture ($H_2O$) which are discharged from the In—Ga—Zn—O-based non-single-crystal film are reduced.

In the graph of FIG. 29, a first peak showing discharge of impurities such as moisture ($H_2O$) can be observed in the vicinity of 200° C. to 250° C., and a second peak showing discharge of impurities such as moisture ($H_2O$) can be observed at 300° C. or higher.

Note that even when the sample which on which heat treatment was performed at 450° C. under a nitrogen atmosphere is left at room temperature for approximately one week in air, discharge of moisture at 200° C. or higher is not observed. Accordingly, it is found that the In—Ga—Zn—O-based non-single-crystal film is stabilized by the heat treatment.

Further, TDS measurement was performed in terms of each of H, O, OH, $H_2$, $O_2$, N, $N_2$, and Ar in addition to $H_2O$. It was possible that a peak be clearly observed in terms of each of $H_2O$, H, O, and OH but not in terms of $H_2$, $O_2$, N, $N_2$, and Ar. Each sample had a structure in which an In—Ga—Zn—O-based non-single-crystal film was formed to a thickness of 50 nm over a glass substrate, and heat conditions were set as follows: at 250° C. for 1 hour under a nitrogen atmosphere; at 350° C. for 1 hour under a nitrogen atmosphere; at 350° C. for 10 hours under a nitrogen atmosphere; and at 450° C. for 1 hour under a nitrogen atmosphere. A glass substrate alone and an In—Ga—Zn—O-based non-single-crystal film on which heat treatment was not performed were each subjected to the measurement as a comparative example. FIG. 30, FIG. 31, FIG. 32, and FIG. 33 show results of TDS measurement in terms of H, O, OH, and $H_2$, respectively. Note that the oxygen density under a nitrogen atmosphere in the above heat conditions was 20 ppm or lower.

According to the above results, it is found that moisture is mainly discharged by heat treatment of an In—Ga—Zn—O-based non-single-crystal film. In other words, discharge of moisture ($H_2O$) from the In—Ga—Zn—O-based non-single-crystal film is mainly caused due to heat treatment, and a product generated by decomposition of a water molecule has an influence on values of TDS measurement in terms of H, O, and OH which are respectively shown in FIG. 30, FIG. 31, and FIG. 32. Note that an In—Ga—Zn—O-based non-single-crystal film is considered to include hydrogen and OH; therefore, these are also discharged by heat treatment.

In this specification, heat treatment under an inert gas atmosphere of nitrogen or a rare gas (such as argon or helium) or under reduced pressure is referred to as heat treatment for dehydration or dehydrogenation. In this specification, "dehydrogenation" does not refer to elimination of only $H_2$ by heat treatment, and "dehydration or dehydrogenation" also refers to elimination of H, OH, and the like for convenience.

After impurities (such as $H_2O$, H, or OH) included in the oxide semiconductor layer are reduced by the heat treatment under an inert gas atmosphere so that the carrier density is increased, slow cooling is performed under an oxygen atmosphere. After the slow cooling, for example, an oxide insulating film is formed in contact with the oxide semiconductor layer; accordingly, the carrier density of the oxide semiconductor layer is reduced and thus reliability is increased.

The resistance of the first oxide semiconductor film and the second oxide semiconductor film is reduced (the carrier density is increased, preferably to $1 \times 10^{18}/cm^3$ or higher) by the heat treatment under a nitrogen atmosphere. Thus, the first oxide semiconductor film and the second oxide semiconductor film each of whose resistance is reduced can be formed. The first oxide semiconductor film and the second oxide semiconductor film each of whose resistance is reduced are processed through an etching step to form a first oxide semiconductor layer and a second oxide semiconductor layer, and further processed through an etching step to form a semiconductor layer and source and drain regions.

After that, an oxide insulating film is formed in contact with the first oxide semiconductor layer whose resistance is reduced, whereby in the first oxide semiconductor layer whose resistance is reduced, the resistance of at least a region in contact with the oxide insulating film is increased (carrier density is reduced, preferably to lower than $1 \times 10^{18}/cm^3$); thus, an oxide semiconductor region whose resistance is increased can be formed. It is important to increase and reduce the carrier density of the first oxide semiconductor film and the second oxide semiconductor film by heating under an inert gas atmosphere (or under reduced pressure), slow cooling under an oxygen atmosphere, formation of the oxide insulating film, and the like in a manufacturing process of a semiconductor device. In other words, the I-type first oxide semiconductor film and the i-type second oxide semiconductor film are subjected to heat treatment for dehydration or dehydrogenation to be oxygen-deficiency type, that is, n-type (such as n⁻ or n⁺-type) oxide semiconductor films, and then the oxide insulating film is formed so that the first oxide semiconductor layer becomes oxygen-excess type, that is, an i-type oxide semiconductor layer. Accordingly, it is possible to manufacture and provide a semiconductor device including a highly reliable thin film transistor having favorable electric characteristics.

Note that as the oxide insulating film formed to be in contact with the first oxide semiconductor layer whose resistance is reduced, an inorganic insulating film which blocks impurities such as moisture, a hydrogen ion, and OH⁻ is used. Specifically a silicon oxide film or a silicon nitride oxide film is used.

Further, after the oxide insulating film serving as a protective film is formed over the semiconductor layer and the source and drain regions, second heating may be performed. When the second heating is performed after the formation of the oxide insulating film serving as a protective film over the semiconductor layer and the source and drain regions, variation in electric characteristics of the thin film transistor can be reduced.

In one embodiment of the structure of the invention disclosed in this specification, a gate electrode layer is formed; a gate insulating layer is formed over the gate electrode layer; a first oxide semiconductor film is formed over the gate insulating layer; a second oxide semiconductor film is formed over the first oxide semiconductor film; the first oxide semiconductor film and the second oxide semiconductor film are heated to be dedydrated or dehydrogenated and then slowly cooled under an oxygen atmosphere; the first oxide semiconductor film and the second oxide semiconductor film which are slowly cooled under the oxygen atmosphere are selectively etched to form a first oxide semiconductor layer and a second oxide semiconductor layer; a conductive film is formed over the first oxide semiconductor layer and the second oxide semiconductor layer; the first oxide semiconductor layer, the second oxide semiconductor layer, and the conductive film are selectively etched to form a semiconductor layer, a source region, a drain region, a source electrode layer, and a drain electrode layer; and an oxide insulating film which is in contact with part of the semiconductor layer is formed over the gate insulating layer, the semiconductor layer, the source region, the drain region, the source electrode layer, and the drain electrode layer so that carrier density is reduced.

In another embodiment of the structure of the invention disclosed in this specification, a gate electrode layer is formed; a gate insulating layer is formed over the gate electrode layer; a first oxide semiconductor film is formed over the gate insulating layer; a second oxide semiconductor film is formed over the first oxide semiconductor film; the first oxide semiconductor film and the second oxide semiconductor film are heated under an inert gas atmosphere so that carrier density is increased and then slowly cooled under an oxygen atmosphere; the first oxide semiconductor film and the second oxide semiconductor film which are slowly cooled under the oxygen atmosphere are selectively etched to form a first oxide semiconductor layer and a second oxide semiconductor layer; a conductive film is formed over the first oxide semiconductor layer and the second oxide semiconductor layer; the first oxide semiconductor layer, the second oxide semiconductor layer, and the conductive film are selectively etched to form a semiconductor layer, a source region, a drain region, a source electrode layer, and a drain electrode layer; and an oxide insulating film which is in contact with part of the semiconductor layer is formed over the gate insulating layer, the semiconductor layer, the source region, the drain region, the source electrode layer, and the drain electrode layer so that carrier density is reduced.

In another embodiment of the structure of the invention disclosed in this specification, a gate electrode layer is formed; a gate insulating layer is formed over the gate electrode layer; a first oxide semiconductor film is formed over the gate insulating layer; a second oxide semiconductor film is formed over the first oxide semiconductor film; the first oxide semiconductor film and the second oxide semiconductor film are heated under reduced pressure so that carrier density is increased and then slowly cooled under an oxygen atmosphere; the first oxide semiconductor film and the second oxide semiconductor film which are slowly cooled under the oxygen atmosphere are selectively etched to form a first oxide semiconductor layer and a second oxide semiconductor layer; a conductive film is formed over the first oxide semiconductor layer and the second oxide semiconductor layer; the first oxide semiconductor layer, the second oxide semiconductor layer, and the conductive film are selectively etched to form a semiconductor layer, a source region, a drain region, a source electrode layer, and a drain electrode layer; and an oxide insulating film which is in contact with part of the semiconductor layer is formed over the gate insulating layer, the semiconductor layer, the source region, a drain region, a source electrode layer, and a drain electrode layer so that carrier density is reduced.

For an oxide semiconductor layer which can be used as the semiconductor layer and the source and drain regions, an oxide material having semiconductor characteristics may be used. For example, thin films expressed by $InMO_3(ZnO)_m$ (m>0) are formed, and a thin film transistor using the thin films as a semiconductor layer and source and drain regions is manufactured. Note that M denotes one metal element or a plurality of metal elements selected from Ga, Fe, Ni, Mn, and Co. For example, M denotes Ga in some cases; meanwhile, M denotes the above metal element such as Ni or Fe in addition to Ga (Ga and Ni or Ga and Fe) in other cases. Further, the above oxide semiconductor may include Fe or Ni, another transitional metal element, or an oxide of the transitional metal as an impurity element in addition to the metal element included as M. In this specification, among the oxide semiconductors whose composition formulas are expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As the oxide semiconductor which is applied to the oxide semiconductor layer, any of the following oxide semiconductors can be applied in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. In addition, the above oxide semiconductor layer may include silicon oxide. Silicon oxide ($SiO_x$ (x>0)), which hinders crystallization, included in the oxide semiconductor layer can suppress crystallization of the oxide semiconductor layer in the case where heat treatment is performed after formation of the oxide semiconductor layer in the manufacturing process. Note that the oxide semiconductor layer is preferably amorphous but may be partly crystallized.

The oxide semiconductor layer is preferably an oxide semiconductor containing In, more preferably an oxide semiconductor containing In and Ga. In order to obtain an I-type (intrinsic) oxide semiconductor, dehydration or dehydrogenation is effective.

In addition, the oxide semiconductor layer used as the source region and the drain region (also referred to as $n^+$ layers or buffer layers) of the thin film transistor preferably has higher conductivity (electrical conductivity) than the oxide semiconductor layer used as a channel formation region.

Since a thin film transistor is easily broken due to static electricity or the like, a protective circuit for protecting a driver circuit is preferably provided over the same substrate for a gate line or a source line. The protective circuit is preferably formed using a non-linear element including an oxide semiconductor.

The gate insulating layer, the first oxide semiconductor film, and the second oxide semiconductor film may be successively treated (also referred to as successive treatment, an insitu process, or successive film formation) without exposure to air. By the successive treatment without exposure to air, each interface between the stacked layers, that is, interfaces of the gate insulating layer, the first oxide semiconductor film, and the second oxide semiconductor film can be formed without being contaminated by an atmospheric component or an impurity element floating in air, such as water or hydrocarbon. Accordingly, variation in characteristics of the thin film transistor can be reduced.

Note that the term "successive treatment" in this specification means that during a process from a first treatment step using a PCVD method or a sputtering method to a second treatment step using a PCVD method or a sputtering method, an atmosphere in which a substrate to be processed is disposed is not contaminated by a contaminant atmosphere such as air, and is constantly controlled to be vacuum or an inert gas atmosphere (a nitrogen atmosphere or a rare gas atmosphere). By the successive treatment, treatment such as film formation can be performed while moisture or the like is prevented from attaching again to the cleaned substrate to be processed.

Performing the process from the first treatment step to the second treatment step in the same chamber is within the scope of the successive treatment in this specification.

In addition, the following is also within the scope of the successive treatment in this specification: in the case of performing the process from the first treatment step to the second treatment step in different chambers, the substrate is transferred after the first treatment step to another chamber without exposure to air and is subjected to the second treatment.

Note that between the first treatment step and the second treatment step, a substrate transfer step, an alignment step, a slow-cooling step, a step of heating or cooling the substrate to a temperature which is necessary for the second treatment step, or the like may be provided. Such a process is also within the scope of the successive treatment in this specification.

A step in which liquid is used, such as a cleaning step, wet etching, or resist formation, may be provided between the first treatment step and the second treatment step. This case is not within the scope of the successive treatment in this specification.

Note that the ordinal numbers such as "first" and "second" in this specification are used for convenience and do not denote the order of steps and the stacking order of layers. In addition, the ordinal numbers in this specification do not denote particular names which specify the invention.

Moreover, as a display device including a driver circuit, a light-emitting display device including a light-emitting element and a display device including an electrophoretic display element, which is also referred to as electronic paper, are given in addition to a liquid crystal display device.

In the light-emitting display device including a light-emitting element, a plurality of thin film transistors are included in a pixel portion, and in the pixel portion, there is a region where a gate electrode of a thin film transistor is connected to a source wiring or a drain wiring of another thin film transistor. In addition, in a driver circuit of the light-emitting display device including a light-emitting element, there is a region where a gate electrode of a thin film transistor is connected to a source wiring or a drain wiring of the thin film transistor.

In this specification, a semiconductor device generally means a device which can function by utilizing semiconductor characteristics, and an electro-optical device, a semiconductor circuit, and an electronic appliance are all semiconductor devices.

A thin film transistor having stable electric characteristics can be manufactured and provided. Accordingly, a semiconductor device including the highly reliable thin film transistor having favorable electric characteristics can be provided.

BRIEF DESCRIPTION OF DRAWINGS

The patent or application file contains at least one drawing executed in color. Copies of this patent or patent application publication with the color drawings will be provided by the Office upon request and payment of the necessary fee.

In the accompanying drawings:

FIGS. 4A to 4C illustrate a method for manufacturing a semiconductor device;

FIGS. 5A to 5C illustrate the method for manufacturing a semiconductor device;

FIGS. 6A and 6B illustrate the method for manufacturing a semiconductor device;

FIGS. 8A1, 8A2, 8B1, and 8B2 illustrate semiconductor devices;

FIGS. 10A1, 10A2, and 10B illustrate a semiconductor device;

BEST MODE FOR CARRYING OUT THE INVENTION

Figure 1A:
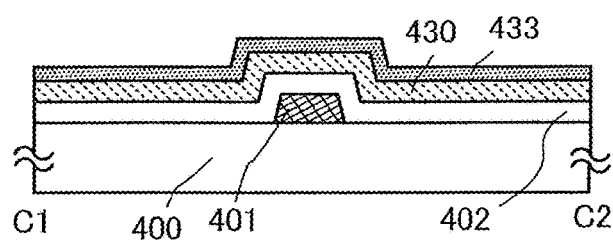
FIGS. 1A to 1C illustrate a method for manufacturing a semiconductor device.

Embodiments and an example will be described in detail with reference to drawings. However, the present invention is not limited to the following description, and it is easily understood by those skilled in the art that various changes and modifications can be made in modes and details without departing from the spirit and scope of the present invention. Therefore, the present invention should not be interpreted as being limited to the description of the embodiments and example below. In the structures described below, the same portions or portions having similar functions are denoted by the same reference numerals in different drawings, and repetitive description thereof is omitted.

Embodiment 1

A semiconductor device and a method for manufacturing the semiconductor device will be described with reference to FIGS. 1A to 1C, FIGS. 2A and 2B, and FIGS. 3A and 3B.

Figure 3A:
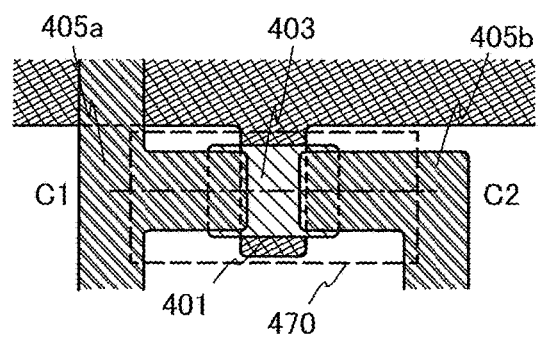
FIGS. 3A and 3B illustrate a semiconductor device.
Figure 3B:
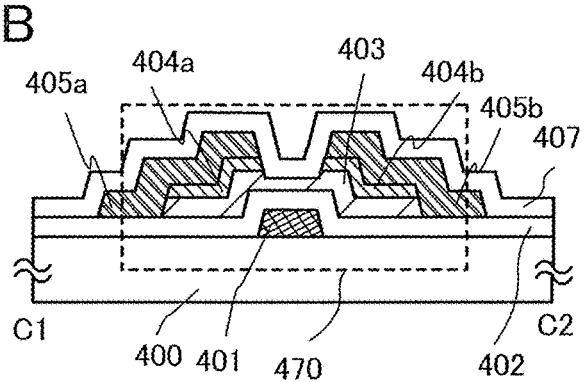

FIG. 3A is a plan view of a thin film transistor 470 included in a semiconductor device, and FIG. 3B is a cross-sectional view taken along line C1-C2 of FIG. 3A. The thin film transistor 470 is an inverted staggered thin film transistor and includes, over a substrate 400 which is a substrate having an insulating surface, a gate electrode layer 401, a gate insulating layer 402, a semiconductor layer 403, source and drain regions 404a and 404b, and source and drain electrode layers 405a and 405b. In addition, an oxide insulating film 407 is provided to cover the thin film transistor 470 and is in contact with the semiconductor layer 403.

Heat treatment (heat treatment for dehydration or dehydrogenation) which reduces impurities such as moisture is performed at least after formation of a first oxide semiconductor film and a second oxide semiconductor film which become the semiconductor layer 403 and the source and drain regions 404a and 404b, so that the resistance of the first oxide semiconductor film and the second oxide semiconductor film is reduced (the carrier density is increased, preferably to $1\times10^{18}/cm^3$ or higher). Then, the oxide insulating film 407 is formed in contact with a first oxide semiconductor layer, whereby the resistance thereof is increased (the carrier density is reduced, preferably to lower than $1\times10^{18}/cm^3$, more preferably to lower than or equal to $1\times10^{14}/cm^3$). Thus, the first oxide semiconductor layer whose resistance is increased can be used as a channel formation region.

Further, after impurities such as moisture ($H_2O$) are eliminated by the heat treatment for dehydration or dehydrogenation, slow cooling is preferably performed under an oxygen atmosphere. After the heat treatment for dehydration or dehydrogenation and the slow cooling under the oxygen atmosphere, the carrier density of the first oxide semiconductor layer is reduced by formation of the oxide insulating film to be in contact with the first oxide semiconductor layer, which results in that reliability of the thin film transistor 470 is increased.

Impurities such as moisture are reduced not only in the semiconductor layer 403 and the source and drain regions 404a and 404b but also in the gate insulating layer 402 and interfaces between the semiconductor layer 403 which is an oxide semiconductor layer and films that are provided over and under and in contact with the semiconductor layer 403, specifically, an interface between the gate insulating layer 402 and the semiconductor layer 403 and an interface between the oxide insulating film 407 and the semiconductor layer 403.

Note that the source and drain electrode layers 405a and 405b that are in contact with the semiconductor layer 403 which is an oxide semiconductor layer and the source and drain regions 404a and 404b are formed using one or more materials selected from titanium, aluminum, manganese, magnesium, zirconium, beryllium, and thorium. Further, a stack of alloy films including any combination of the above elements may be used.

For the semiconductor layer 403 including a channel formation region and the source and drain regions 404a and 404b, an oxide material having semiconductor characteristics may be used. For example, an oxide semiconductor having a structure expressed by $InMO_3(ZnO)_m$ (m>0) can be used, and in particular, an In—Ga—Zn—O-based oxide semiconductor is preferably used. Note that M denotes one metal element or a plurality of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may include Fe or Ni, another transitional metal element, or an oxide of the transitional metal as an impurity element in addition to the metal element included as M. In this specification, among the oxide semiconductors whose composition formulas are expressed by $InMO_3(ZnO)_m$ (m>0), an oxide semiconductor which includes at least Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As the oxide semiconductor which is applied to the oxide semiconductor layer, any of the following oxide semiconductors can be applied in addition to the above: an In—Sn—

Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor. In addition, the above oxide semiconductor may include silicon oxide.

The source region is provided between the semiconductor layer (also referred to as the first oxide semiconductor layer) and the source electrode layer, and the drain region is provided between the semiconductor layer and the drain electrode layer. As the source and drain regions, an oxide semiconductor layer having n-type conductivity (also referred to as the second oxide semiconductor layer) can be used.

In addition, it is preferable that the second oxide semiconductor layer used as the source and drain regions 404$a$ and 404$b$ of the thin film transistor be thinner and have higher conductivity (electrical conductivity) than the first oxide semiconductor layer used as a channel formation region.

Further, the first oxide semiconductor layer used as the channel formation region has an amorphous structure and the second oxide semiconductor layer used as the source and drain regions includes a crystal grain (nanocrystal) in the amorphous structure in some cases. The crystal grain (nanocrystal) in the second oxide semiconductor layer used as the source and drain regions has a diameter of 1 nm to 10 nm, typically 2 nm to 4 nm, approximately.

In this embodiment, In—Ga—Zn—O-based non-single-crystal films are used as the semiconductor layer 403 including the channel formation region and the source and drain regions (also referred to as $n^+$ layers or buffer layers) 404$a$ and 404$b$.

FIGS. 1A to 1C and FIGS. 2A and 2B are cross-sectional views illustrating a manufacturing process of the thin film transistor 470.

The gate electrode layer 401 is provided over the substrate 400 which is a substrate having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more films selected from a silicon nitride film, a silicon oxide film, a silicon nitride oxide film, and a silicon oxynitride film. The gate electrode layer 401 can be formed to have a single-layer or stacked-layer structure using a metal material such as molybdenum, titanium, chromium, tantalum, tungsten, aluminum, copper, neodymium, or scandium, or an alloy material containing any of these materials as its main component.

For example, as a stacked-layer structure of two layers of the gate electrode layer 401, the following structures are preferable: a two-layer structure of an aluminum layer and a molybdenum layer stacked thereover; a two-layer structure of a copper layer and a molybdenum layer stacked thereover; a two-layer structure of a copper layer and a titanium nitride layer or a tantalum nitride layer stacked thereover; and a two-layer structure of a titanium nitride layer and a molybdenum layer. As a stacked-layer structure of three layers, a stack of a tungsten layer or a tungsten nitride layer, a layer of an alloy of aluminum and silicon or a layer of an alloy of aluminum and titanium, and a titanium nitride layer or a titanium layer is preferable.

The gate insulating layer 402 is formed over the gate electrode layer 401.

The gate insulating layer 402 can be formed using a single layer or stacked layers of any of a silicon oxide layer, a silicon nitride layer, a silicon oxynitride layer, and a silicon nitride oxide layer with a plasma CVD method, a sputtering method, or the like. For example, a silicon oxynitride layer may be formed with a plasma CVD method using $SiH_4$, oxygen, and nitrogen as a film-formation gas.

A first oxide semiconductor film 430 and a second oxide semiconductor film 433 are formed to be stacked over the gate insulating layer 402 (see FIG. 1A). The first oxide semiconductor film 430 serves as a semiconductor layer which functions as a channel formation region, and the second oxide semiconductor film 433 serves as source and drain regions.

Note that before the oxide semiconductor films are formed with a sputtering method, reverse sputtering in which an argon gas is introduced and plasma is generated is preferably performed to remove dust attached to a surface of the gate insulating layer 402. The reverse sputtering refers to a method in which, without application of voltage to a target side, an RF power source is used for application of voltage to a substrate side under an argon atmosphere to generate plasma in the vicinity of the substrate so that a surface is modified. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

As the oxide semiconductor films, In—Ga—Zn—O-based non-single-crystal films are used. The oxide semiconductor films are formed with a sputtering method using an In—Ga—Zn—O-based oxide semiconductor target. The oxide semiconductor films can be formed with a sputtering method under a rare gas (typically argon) atmosphere, an oxygen atmosphere, or an atmosphere of a rare gas (typically argon) and oxygen.

The gate insulating layer 402, the first oxide semiconductor film 430, and the second oxide semiconductor film 433 may be successively formed without exposure to air. By successive film formation without exposure to air, each interface of the stacked layers can be formed without being contaminated by an atmospheric component or an impurity element floating in air, such as water or hydrocarbon. Therefore, variation in characteristics of the thin film transistor can be reduced.

Figure 1B:
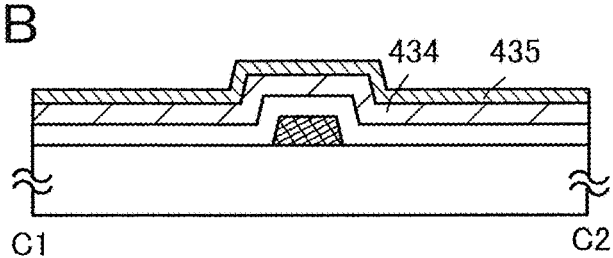

The first oxide semiconductor film 430 and the second oxide semiconductor film 433 are subjected to heat treatment under an atmosphere of an inert gas (such as nitrogen, helium, neon, or argon) or under reduced pressure, and then slowly cooled under an oxygen atmosphere (see FIG. 1B). When the heat treatment under the above atmosphere is performed on the first oxide semiconductor film 430 and the second oxide semiconductor film 433, impurities such as moisture or hydrogen which are included in the first oxide semiconductor film 430 and the second oxide semiconductor film 433 can be removed.

Note that it is preferable that impurities such as moisture or hydrogen be not included in nitrogen or a rare gas such as helium, neon, or argon in the heat treatment. In addition, nitrogen or a rare gas such as helium, neon, or argon which is introduced into a heat treatment apparatus preferably has a purity of 6N (99.9999%) or higher, more preferably 7N (99.99999%) or higher (that is, the density of impurities is 1 ppm or lower, preferably 0.1 ppm or lower).

Further, in the heat treatment, a heating method using an electric furnace or an instantaneous heating method such as a gas rapid thermal anneal (GRTA) method using a heated gas or a lamp rapid thermal anneal (LRTA) method can be used.

Here, as one mode of the heat treatment for the first oxide semiconductor film 430 and the second oxide semiconductor film 433, a heating method using an electric furnace 601 is described with reference to FIG. 28.

Figure 28:
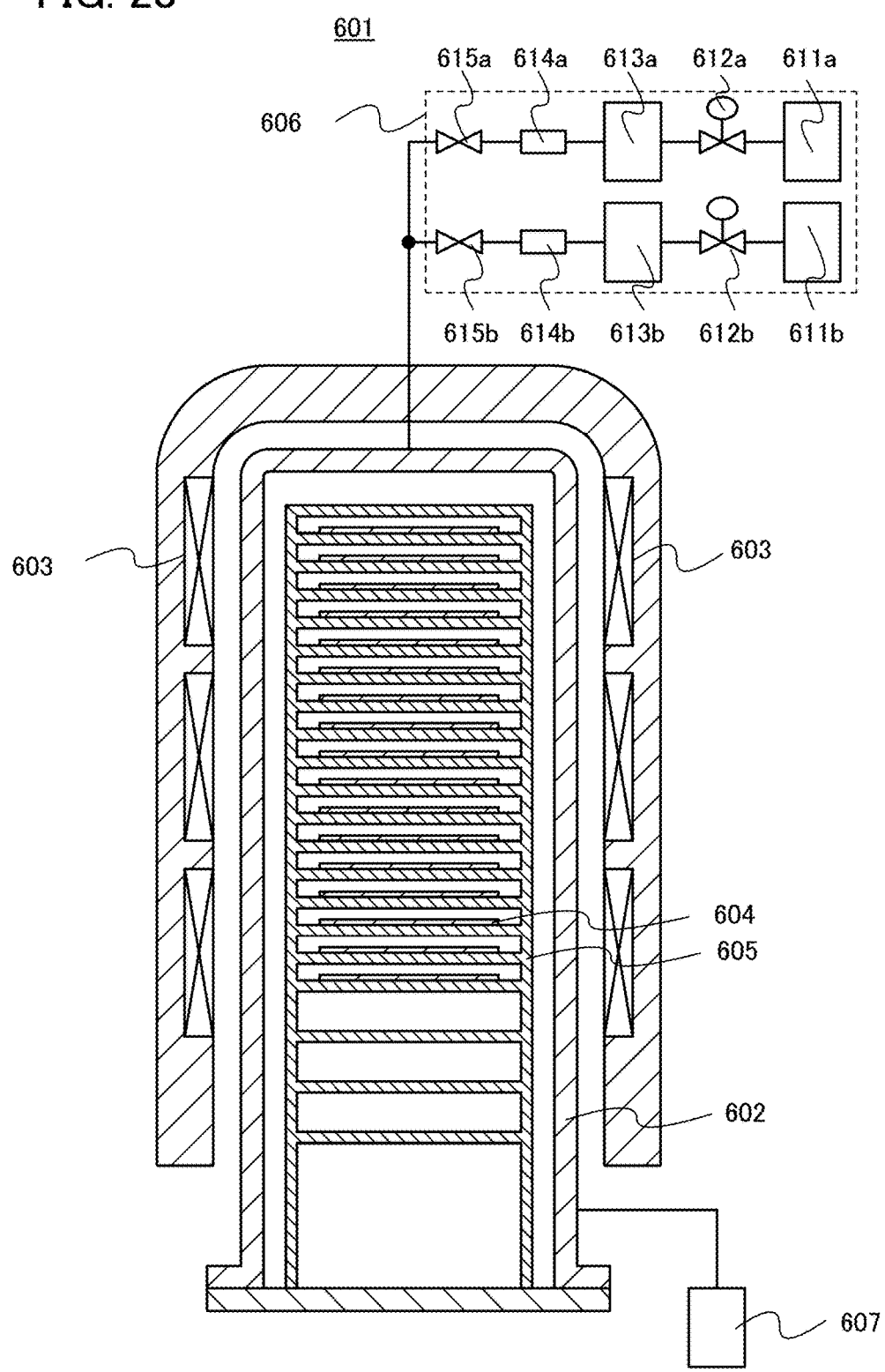
FIG. 28 is a cross-sectional view illustrating an electric furnace.
Figure 29:
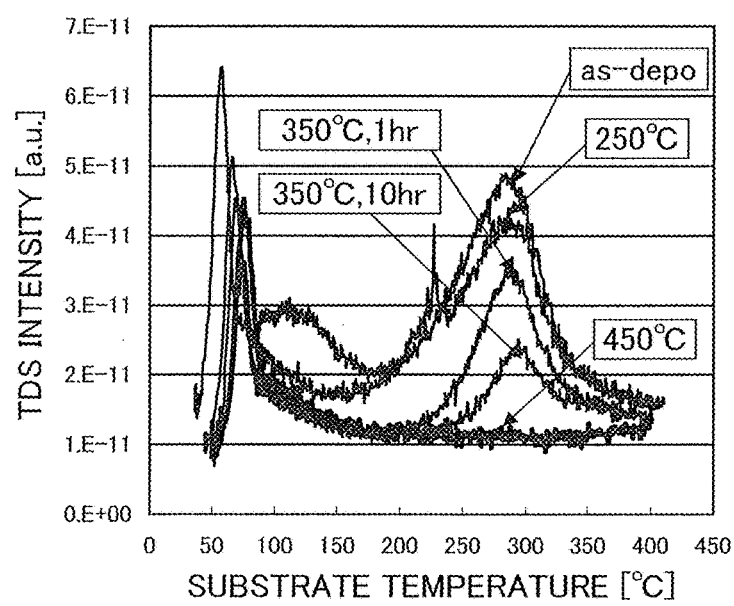
FIG. 29 is a graph showing results of TDS measurement.
Figure 30:
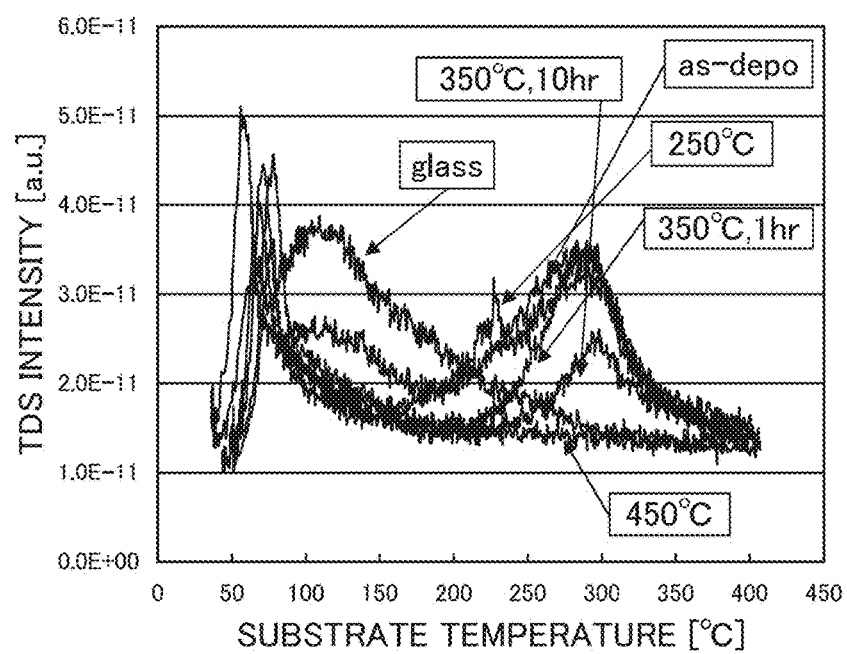
FIG. 30 is a graph showing results of TDS measurement in terms of H.
Figure 31:
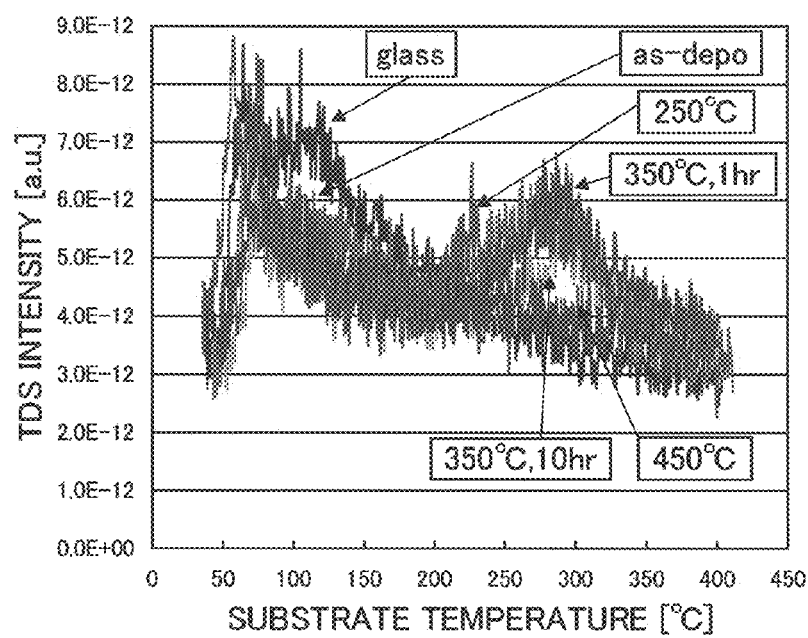
FIG. 31 is a graph showing results of TDS measurement in terms of O.
Figure 32:
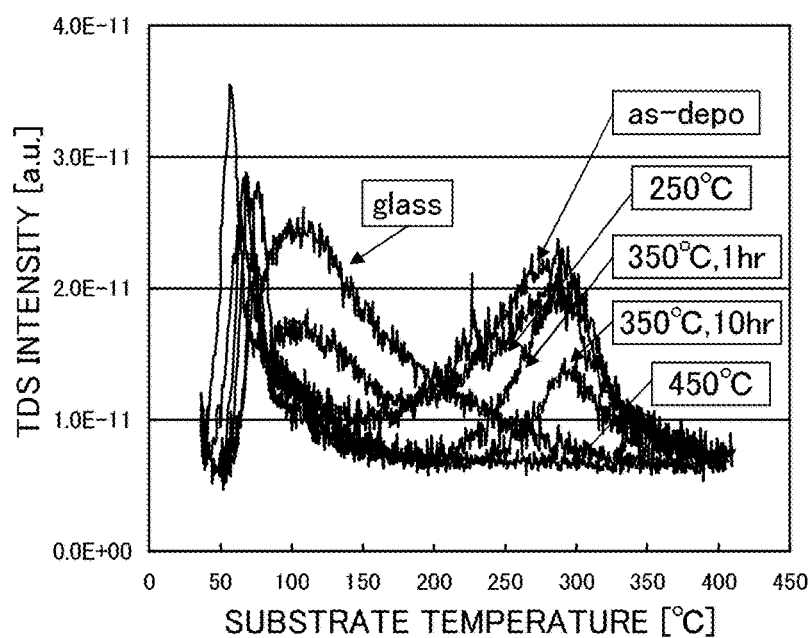
FIG. 32 is a graph showing results of TDS measurement in terms of OH.
Figure 33:
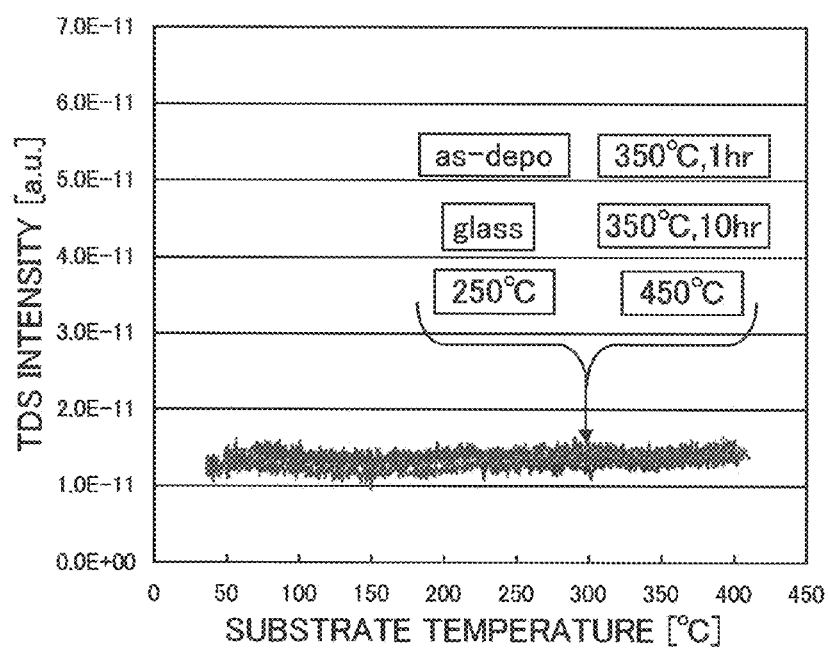
FIG. 33 is a graph showing results of TDS measurement in terms of $H_2$.

FIG. 28 is a schematic view of the electric furnace 601. A heater 603 is provided outside a chamber 602 and used for heating the chamber 602. A susceptor 605 on which a substrate 604 is set is provided in the chamber 602, and the substrate 604 is carried into or out of the chamber 602. Further, the chamber 602 is provided with a gas supply unit 606 and an evacuation unit 607. A gas is introduced into the chamber 602 by the gas supply unit 606. The evacuation unit 607 evacuates the chamber 602 or reduces the pressure in the chamber 602. Note that the temperature rise characteristics of the electric furnace 601 is preferably set at higher than or equal to 0.1° C./min and lower than or equal to 20° C./min. In addition, the temperature drop characteristics of the electric furnace 601 is preferably set at higher than or equal to 0.1° C./min and lower than or equal to 15° C./min.

The gas supply unit 606 includes a gas supply source 611a, a gas supply source 611b, a pressure adjusting valve 612a, a pressure adjusting valve 612b, a refiner 613a, a refiner 613b, a mass flow controller 614a, a mass flow controller 614b, a stop valve 615a, and a stop valve 615b. In this embodiment, the refiner 613a and the refiner 613b are preferably provided between the gas supply source 611a and the gas supply source 611b, and the chamber 602. With the refiner 613a and the refiner 613b, impurities such as moisture or hydrogen in a gas which is introduced into the chamber 602 from the gas supply source 611a and the gas supply source 611b can be removed by the refiner 613a and the refiner 613b, so that entry of impurities such as moisture or hydrogen into the chamber 602 can be suppressed.

In this embodiment, nitrogen or a rare gas is introduced into the chamber 602 from the gas supply source 611a and the gas supply source 611b so that the atmosphere in the chamber is a nitrogen or rare gas atmosphere, and the first oxide semiconductor film 430 and the second oxide semiconductor film 433 which are formed over the substrate 604 are heated in the chamber 602 heated to higher than or equal to 200° C. and lower than or equal to 600° C., preferably higher than or equal to 400° C. and lower than or equal to 450° C. In this manner, dehydration or dehydrogenation of the first oxide semiconductor film 430 and the second oxide semiconductor film 433 can be performed.

Alternatively, dehydration or dehydrogenation of the first oxide semiconductor film 430 and the second oxide semiconductor film 433 can be performed in such a manner that, with the pressure reduced by the evacuation unit, the first oxide semiconductor film 430 and the second oxide semiconductor film 433 which are formed over the substrate 604 are heated in the chamber 602 heated to higher than or equal to 200° C. and lower than or equal to 600° C., preferably higher than or equal to 400° C. and lower than or equal to 450° C.

Next, introduction of nitrogen or a rare gas from the gas supply source 611a into the chamber 602 is stopped, and further, the heater is turned off. Then, oxygen is introduced into the chamber 602 from the gas supply source 611b, and the chamber 602 of the heating apparatus is slowly cooled.

That is, the atmosphere in the chamber 602 is changed to an oxygen atmosphere, and the substrate 604 is slowly cooled. Here, it is preferable that impurities such as moisture or hydrogen be not included in oxygen which is introduced into the chamber 602 from the gas supply source 611b. In addition, oxygen which is introduced into the chamber 602 from the gas supply source 611b preferably has a purity of 6N (99.9999%) or higher, more preferably 7N (99.99999%) or higher (that is, the density of impurities in the oxygen is 1 ppm or lower, preferably 0.1 ppm or lower). By the heat treatment under an inert gas atmosphere or under reduced pressure, the resistance of the oxide semiconductor films is reduced (the carrier density is increased, preferably to $1\times10^{18}/cm^3$ or higher). Thus, a first oxide semiconductor film 434 and a second oxide semiconductor film 435 each of whose resistance is reduced can be formed.

As a result, reliability of the thin film transistor to be completed later can be improved.

Note that when the heat treatment is performed under reduced pressure, cooling may be performed by introducing oxygen into the chamber 602 after the heat treatment so that the pressure returns to atmospheric pressure.

In addition, at the same time as introduction of oxygen into the chamber 602 from the gas supply source 611b, one of or both nitrogen and a rare gas such as helium, neon, or argon may be introduced into the chamber 602.

Alternatively, after the substrate 604 in the chamber 602 of the heating apparatus is cooled to 300° C., the substrate 604 may be transferred into an atmosphere of room temperature. This results in that cooling time for the substrate 604 can be shortened.

When the heating apparatus has multiple chambers, the heat treatment and the cooling treatment can be performed in different chambers. Typically, in a first chamber which is filled with nitrogen or a rare gas and heated to higher than or equal to 200° C. and lower than or equal to 600° C., preferably higher than or equal to 400° C. and lower than or equal to 450° C., the oxide semiconductor films over the substrate are heated. Next, the substrate on which the above heat treatment is performed is transferred, through a transfer chamber into which nitrogen or an inert gas is introduced, to a second chamber which is filled with oxygen and whose temperature is lower than or equal to 100° C., preferably room temperature, and is subjected to cooling treatment. By the above process, throughput can be improved.

After the heat treatment under an inert gas atmosphere or under reduced pressure, slow cooling to higher than or equal to room temperature and lower than 100° C. is performed under an oxygen atmosphere, the substrate provided with the first oxide semiconductor film 434 and the second oxide semiconductor film 435 is taken out of the heating apparatus, and a photolithography step is performed.

The first oxide semiconductor film 434 and the second oxide semiconductor film 435 after the heat treatment under an inert gas atmosphere or under reduced pressure are preferably in an amorphous state, but may be partly crystallized.

Figure 1C:
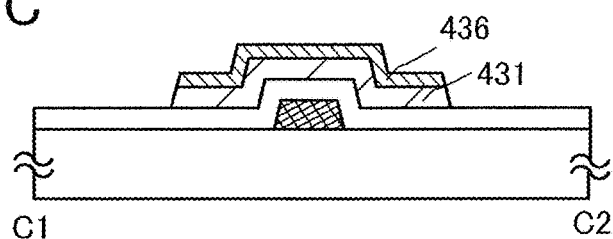

The first oxide semiconductor film 434 and the second oxide semiconductor film 435 are processed into a first oxide semiconductor layer 431 and a second oxide semiconductor layer 436 which are island-like oxide semiconductor layers through the photolithography step (see FIG. 1C).

A conductive film is formed over the gate insulating layer 402, the first oxide semiconductor layer 431, and the second oxide semiconductor layer 436.

As a material for the conductive film, an element selected from Al, Cr, Ta, Ti, Mo, and W; an alloy containing any of the above elements as its component; an alloy film containing a combination of any of the above elements; and the like can be given.

In the case where heat treatment is performed after the formation of the conductive film, it is preferable that the conductive film have heat resistance enough to withstand the heat treatment. Since Al alone has disadvantages such as low heat resistance and a tendency to be corroded, aluminum is used in combination with a heat-resistant conductive material. As the heat-resistant conductive material which is used in combination with Al, any of the following materials may be used: an element selected from titanium (Ti), tantalum (Ta), tungsten (W), molybdenum (Mo), chromium (Cr), neodymium (Nd), and scandium (Sc); an alloy containing any of the above elements as a component; an alloy film containing a combination of any of the above elements; and a nitride containing any of the above elements as a component.

Figure 2A:
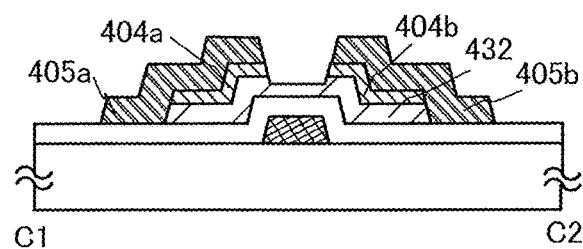
FIGS. 2A and 2B illustrate the method for manufacturing a semiconductor device.
Figure 2B:
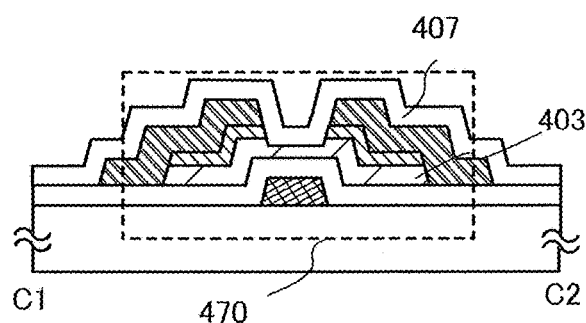

The first oxide semiconductor layer 431, the second oxide semiconductor layer 436, and the conductive film are etched through an etching step to form a first oxide semiconductor layer 432, the source and drain regions 404a and 404b, and the source and drain electrode layers 405a and 405b (see FIG. 2A). Note that only part of the first oxide semiconductor layer 431 is etched, so that the first oxide semiconductor layer 432 has a depression (a recessed portion).

A silicon oxide film is formed as the oxide insulating film 407 with a sputtering method so as to be in contact with the first oxide semiconductor layer 432. The oxide insulating film 407 which is formed to be in contact with the oxide semiconductor layer whose resistance is reduced does not contain impurities such as moisture, a hydrogen ion, and OH$^-$ and is formed using an inorganic insulating film which prevents the impurities from entering from the outside. Specifically, a silicon oxide film or a silicon nitride oxide film is used.

In this embodiment, a silicon oxide film is formed to a thickness of 300 nm as the oxide insulating film 407. The substrate temperature in the film formation may be higher than or equal to room temperature and lower than or equal to 300° C., and is set at 100° C. in this embodiment. Formation of the silicon oxide film with a sputtering method can be performed under a rare gas (typically argon) atmosphere, an oxygen atmosphere, or an atmosphere of a rare gas (typically argon) and oxygen. Further, either a silicon oxide target or a silicon target may be used as a target. For example, the silicon oxide film can be formed with a sputtering method using a silicon target under an atmosphere of oxygen and nitrogen.

When the oxide insulating film 407 is formed with a sputtering method, a PCVD method, or the like so as to be in contact with the first oxide semiconductor layer 432 whose resistance is reduced, in the first oxide semiconductor layer 432 whose resistance is reduced, the resistance of at least a region in contact with the oxide insulating film 407 is increased (the carrier density is reduced, preferably to lower than $1\times10^{18}/cm^3$, more preferably to lower than or equal to $1\times10^{14}/cm^3$); thus, an oxide semiconductor region whose resistance is increased can be formed. It is important to increase and reduce the carrier density of the oxide semiconductor layer by heating under an inert gas atmosphere (or under reduced pressure), slow cooling under an oxygen atmosphere, formation of the oxide insulating film, and the like in a manufacturing process of the semiconductor device. The first oxide semiconductor layer 432 serves as the semiconductor layer 403 including the oxide semiconductor region whose resistance is increased. In this manner, the thin film transistor 470 can be manufactured (see FIG. 2B).

Impurities (such as $H_2O$, H, or OH) included in the first oxide semiconductor film and the second oxide semiconductor film are reduced by the above heat treatment for dehydration or dehydrogenation so that the carrier density is increased, and then slow cooling is performed under an oxygen atmosphere. After the slow cooling, the first oxide semiconductor film is processed into an island-like first oxide semiconductor layer, and an oxide insulating film is formed in contact with the first oxide semiconductor layer so that the carrier density of the first oxide semiconductor layer is reduced. When the first oxide semiconductor layer whose carrier density is reduced is used as a semiconductor layer, reliability of the thin film transistor 470 can be improved.

Further, after the oxide insulating film 407 is formed, the thin film transistor 470 may be subjected to heat treatment (preferably at higher than or equal to 150° C. and lower than 350° C.) under a nitrogen atmosphere or an air atmosphere (in air). For example, heat treatment is performed at 250° C. for 1 hour under a nitrogen atmosphere. By the heat treatment, the semiconductor layer 403 is heated while being in contact with the oxide insulating film 407. Accordingly, variation in electric characteristics of the thin film transistor 470 can be reduced. There is no particular limitation on this heat treatment (preferably at higher than or equal to 150° C. and lower than 350° C.) as long as it is performed after the formation of the oxide insulating film 407. When the heat treatment serves also as another step such as heat treatment in formation of a resin film or heat treatment for reducing the resistance of a transparent conductive film, the heat treatment can be performed without increase in the number of steps.

Embodiment 2

A semiconductor device and a method for manufacturing the semiconductor device will be described with reference to FIG. 26. The same portions as Embodiment 1 or portions having functions similar to those of Embodiment 1 can be formed in a manner similar to that of Embodiment 1, and repetitive description thereof is omitted.

Figure 26:
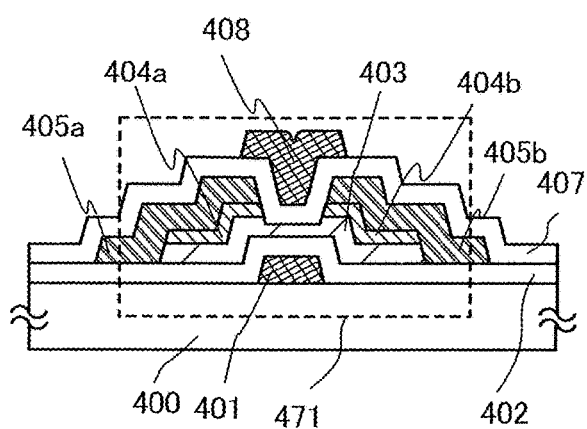
FIG. 26 illustrates a semiconductor device.

A thin film transistor 471 illustrated in FIG. 26 is an example in which a conductive layer 408 is provided so as to overlap with the gate electrode layer 401 and a channel region of the semiconductor layer 403 with an insulating film interposed between the conductive layer 408 and the semiconductor layer 403.

FIG. 26 is a cross-sectional view of the thin film transistor 471 included in a semiconductor device. The thin film transistor 471 is a bottom-gate thin film transistor in which, over the substrate 400 which is a substrate having an insulating surface, the gate electrode layer 401, the gate insulating layer 402, the semiconductor layer 403, the source and drain regions 404a and 404b, the source and drain electrode layers 405a and 405b, and the conductive layer 408 are provided. The conductive layer 408 is provided over the oxide insulating film 407 so as to overlap with the gate electrode layer 401.

The conductive layer 408 can be formed using a material and a method similar to those of the gate electrode layer 401 and the source and drain electrode layers 405a and 405b. In the case where a pixel electrode layer is provided, the conductive layer 408 can be formed using a material and a method similar to those of the pixel electrode layer. In this embodiment, a stack of a titanium film, an aluminum film, and a titanium film is used for the conductive layer 408.

The conductive layer 408 may have potential which is the same as or different from that of the gate electrode layer 401, and can function as a second gate electrode layer. Further, the conductive layer 408 may be in a floating state.

When the conductive layer 408 is provided in a position overlapping with the semiconductor layer 403, in a bias-temperature stress test (hereinafter referred to as a BT test) for examining reliability of a thin film transistor, the amount of fluctuation in threshold voltage of the thin film transistor 471 before and after the BT test can be reduced. Especially in a −BT test in which a voltage of −20 V is applied to a gate after the substrate temperature is raised to 150° C., fluctuation in the threshold voltage can be suppressed.

This embodiment can be implemented in appropriate combination with Embodiment 1.

Embodiment 3

A semiconductor device and a method for manufacturing the semiconductor device will be described with reference to FIG. 27. The same portions as Embodiment 1 or portions having functions similar to those of Embodiment 1 can be formed in a manner similar to that of Embodiment 1, and repetitive description thereof is omitted.

Figure 27:
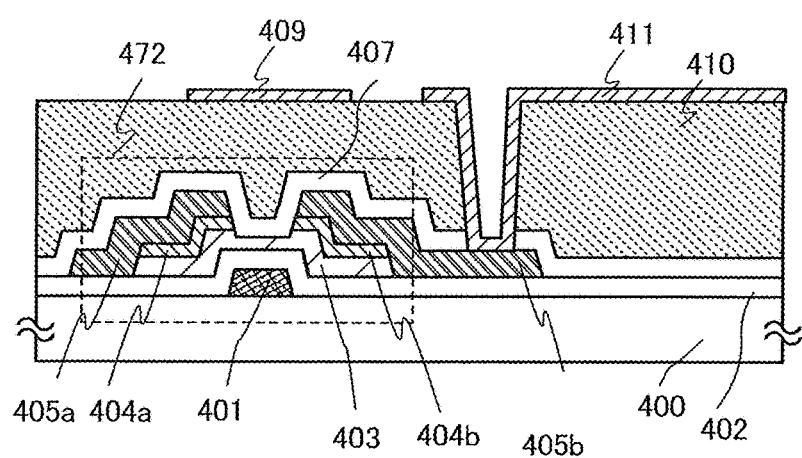
FIG. 27 illustrates a semiconductor device.

A thin film transistor 472 illustrated in FIG. 27 is an example in which a conductive layer 409 is provided so as to overlap with the gate electrode layer 401 and a channel region of the semiconductor layer 403 with the oxide insulating film 407 and an insulating layer 410 interposed between the conductive layer 409 and the semiconductor layer 403.

FIG. 27 is a cross-sectional view of the thin film transistor 472 included in a semiconductor device. The thin film transistor 472 is a bottom-gate thin film transistor in which, over the substrate 400 which is a substrate having an insulating surface, the gate electrode layer 401, the gate insulating layer 402, the semiconductor layer 403, the source and drain regions 404a and 404b, the source and drain electrode layers 405a and 405b, and the conductive layer 409 are provided. The conductive layer 409 is provided over the oxide insulating film 407 and the insulating layer 410 so as to overlap with the gate electrode layer 401.

In this embodiment, the insulating layer 410 which functions as a planarization film is stacked over the oxide insulating film 407, and an opening which reaches the source or drain electrode layer 405b is formed in the oxide insulating film 407 and the insulating layer 410. A conductive film is formed in the opening which is formed in the oxide insulating film 407 and the insulating layer 410 and etched into a desired shape, so that the conductive layer 409 and a pixel electrode layer 411 are formed. In this manner, the conductive layer 409 can be formed in the step of forming the pixel electrode layer 411, using a similar material and method. In this embodiment, indium oxide-tin oxide alloy including silicon oxide (an In—Sn—O-based oxide including silicon oxide) is used for the pixel electrode layer 411 and the conductive layer 409.

Alternatively, the conductive layer 409 may be formed using a material and a method similar to those of the gate electrode layer 401 and the source and drain electrode layers 405a and 405b.

The conductive layer 409 may have potential which is the same as or different from that of the gate electrode layer 401, and can function as a second gate electrode layer. Further, the conductive layer 409 may be in a floating state.

When the conductive layer 409 is provided in a position overlapping with the semiconductor layer 403, in a bias-temperature stress test (hereinafter referred to as a BT test) for examining reliability of a thin film transistor, the amount of fluctuation in threshold voltage of the thin film transistor 472 before and after the BT test can be reduced.

This embodiment can be implemented in appropriate combination with any of the structures described in the other embodiments.

Embodiment 4

A manufacturing process of a semiconductor device including a thin film transistor will be described with reference to FIGS. 4A to 4C, FIGS. 5A to 5C, FIGS. 6A and 6B, FIG. 7, and FIGS. 8A1, 8A2, 8B1, and 8B2.

In FIG. 4A, as a substrate 100 having a light-transmitting property, a glass substrate of barium borosilicate glass, aluminoborosilicate glass, or the like can be used.

Next, a conductive layer is formed entirely over a surface of the substrate 100, and then a first photolithography process is performed. A resist mask is formed and unnecessary portions are removed by etching, so that wirings and an electrode (a gate wiring including a gate electrode layer 101, a capacitor wiring 108, and a first terminal 121) are formed. At this time, the etching is performed so that at least end portions of the gate electrode layer 101 are tapered.

Each of the gate wiring including the gate electrode layer 101, the capacitor wiring 108, and the first terminal 121 in a terminal portion is preferably formed using a heat-resistant conductive material such as an element selected from titanium (Ti), tantalum (Ta), tungsten (W), molybdenum (Mo), chromium (Cr), neodymium (Nd), and scandium (Sc); an alloy containing any of these elements as its component; an alloy film containing a combination of any of the above elements; or a nitride containing any of the above elements as its component. In the case where a low-resistant conductive material such as aluminum (Al) or copper (Cu) is used, the low-resistant conductive material is used in combination with the above heat-resistant conductive material because Al alone or Cu alone has disadvantages such as low heat resistance and a tendency to be corroded.

Next, a gate insulating layer 102 is formed entirely over a surface of the gate electrode layer 101 (see FIG. 4A). The gate insulating layer 102 is formed to a thickness of 50 nm to 250 nm with a sputtering method, a PCVD method, or the like.

For example, as the gate insulating layer 102, a silicon oxide film is formed to a thickness of 100 nm with a sputtering method. Needless to say, the gate insulating layer 102 is not limited to such a silicon oxide film and may be formed to have a single-layer structure or a stacked-layer structure using another insulating film such as a silicon oxynitride film, a silicon nitride film, an aluminum oxide film, or a tantalum oxide film.

Next, a first oxide semiconductor film 131 (a first In—Ga—Zn—O-based non-single-crystal film) is formed over the gate insulating layer 102. The first oxide semiconductor film 131 is formed without exposure to air after plasma treatment, which is advantageous in that dust or moisture is not attached to an interface between the gate insulating layer and the semiconductor film. Here, the first oxide semiconductor film 131 is formed under an argon or oxygen atmosphere using an oxide semiconductor target having a diameter of 8 inches and including In, Ga, and Zn ($In_2O_3:Ga_2O_3:ZnO=1:1:1$), with the distance between the substrate and the target set to 170 mm, under a pressure of 0.4 Pa, and with a direct current (DC) power source of 0.5 kW. Note that a pulse direct current (DC) power source is preferable because dust can be reduced and the film thickness can be uniform. The thickness of the first oxide semiconductor film 131 is set to 5 nm to 200 nm. As the first oxide semiconductor film 131, an In—Ga—Zn—O-based non-single-crystal film is formed to a thickness of 50 nm with a sputtering method using an In—Ga—Zn—O-based oxide semiconductor target.

Next, a second oxide semiconductor film 136 (a second In—Ga—Zn—O-based non-single-crystal film) is formed with a sputtering method without exposure to air (see FIG. 4B). Here, sputtering is performed using a target of $In_2O_3$:$Ga_2O_3$:ZnO=1:1:1 under film formation conditions where the pressure is 0.4 Pa, the power is 500 W, the film formation temperature is room temperature, and an argon gas is introduced at a flow rate of 40 sccm. Although the target of $In_2O_3$:$Ga_2O_3$:ZnO=1:1:1 is used, an In—Ga—Zn—O-based non-single-crystal film including a crystal grain which has a size of 1 nm to 10 nm just after the film formation is obtained in some cases. Note that it can be said that the presence or absence of crystal grains or the density of crystal grains can be adjusted and the diameter size can be adjusted within the range of 1 nm to 10 nm by appropriate adjustment of the film formation conditions of reactive sputtering, such as the composition ratio in the target, the film formation pressure (0.1 Pa to 2.0 Pa), the power (250 W to 3000 W:8 inches $\phi$), and the temperature (room temperature to 100° C.). The second In—Ga—Zn—O-based non-single-crystal film has a thickness of 5 nm to 20 nm. Needless to say, the size of a crystal grain included in the film does not exceed the film thickness. Here, the thickness of the second In—Ga—Zn—O-based non-single-crystal film is 5 nm.

The first In—Ga—Zn—O-based non-single-crystal film is formed under film formation conditions different from those for the second In—Ga—Zn—O-based non-single-crystal film. For example, the first In—Ga—Zn—O-based non-single-crystal film is formed under conditions where the ratio of an oxygen gas flow rate to an argon gas flow rate is higher than the ratio of an oxygen gas flow rate to an argon gas flow rate under the film formation conditions for the second In—Ga—Zn—O-based non-single-crystal film. Specifically, the second In—Ga—Zn—O-based non-single-crystal film is formed under a rare gas (such as argon or helium) atmosphere (or an atmosphere including an oxygen gas at less than or equal to 10% and an argon gas at greater than or equal to 90%), and the first In—Ga—Zn—O-based non-single-crystal film is formed under an oxygen mixed atmosphere (an oxygen gas flow rate is higher than a rare gas flow rate).

A chamber used for formation of the second In—Ga—Zn—O-based non-single-crystal film may be the same as or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a film formation method with a sputtering method, there are also a reactive sputtering method in which a target substance and a sputtering gas component are chemically reacted with each other during film formation to form a thin compound film thereof, and a bias sputtering method in which voltage is also applied to a substrate during film formation.

Next, the first oxide semiconductor film 131 and the second oxide semiconductor film 136 are subjected to heat treatment for dehydration or dehydrogenation. The first oxide semiconductor film 131 and the second oxide semiconductor film 136 are subjected to heat treatment under an atmosphere of an inert gas (such as nitrogen, helium, neon, or argon) or under reduced pressure, and then slowly cooled under an oxygen atmosphere.

The heat treatment is preferably performed at 200° C. or higher. For example, heat treatment is performed at 450° C. for 1 hour under a nitrogen atmosphere. By this heat treatment under a nitrogen atmosphere, the resistance of the first oxide semiconductor film 131 and the second oxide semiconductor film 136 is reduced (the carrier density is increased, preferably to $1 \times 10^{18}$/cm$^3$ or higher) and the conductivity thereof is increased. Thus, a first oxide semiconductor film 133 and a second oxide semiconductor film 137 each of whose resistance is reduced are formed (see FIG. 4C). The electrical conductivity of the first oxide semiconductor film 133 and the second oxide semiconductor film 137 is preferably higher than or equal to $1 \times 10^{-1}$ S/cm and lower than or equal to $1 \times 10^2$ S/cm.

Next, a second photolithography step is performed. A resist mask is formed, and the first oxide semiconductor film 133 and the second oxide semiconductor film 137 are etched. For example, unnecessary portions are removed by wet etching using a mixed solution of phosphoric acid, acetic acid, and nitric acid, so that a first oxide semiconductor layer 134 and a second oxide semiconductor layer 138 are formed. Note that etching here is not limited to wet etching, and dry etching may also be performed.

As an etching gas for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO-07N (produced by Kanto Chemical Co., Inc.) may be used.

Furthermore, the etchant after the wet etching is removed together with the etched material by cleaning. The waste liquid of the etchant including the material etched off may be purified and the material may be reused. When a material such as indium included in the oxide semiconductor layer is collected from the waste liquid after the etching and reused, the resources can be efficiently used and the cost can be reduced.

In order to obtain a desired shape by etching, the etching conditions (such as an etchant, etching time, and temperature) are adjusted as appropriate depending on the material.

Next, a conductive film 132 is formed using a metal material over the first oxide semiconductor layer 134 and the second oxide semiconductor layer 138 with a sputtering method or a vacuum evaporation method (see FIG. 5B).

As the material of the conductive film 132, there are an element selected from Al, Cr, Ta, Ti, Mo, and W, an alloy containing any of these elements as a component, an alloy film containing a combination of any of these elements, and the like.

In the case where heat treatment is performed after the formation of the conductive film 132, the conductive film preferably has heat resistance enough to withstand the heat treatment.

Next, a third photolithography step is performed. A resist mask is formed, and unnecessary portions are removed by etching, so that source and drain electrode layers 105a and 105b, a first oxide semiconductor layer 135, source and drain regions 104a and 104b, and a second terminal 122 are formed (see FIG. 5C). Wet etching or dry etching is employed as an etching method at this time. For example, when an aluminum film or an aluminum-alloy film is used as the conductive film 132, wet etching using a mixed solution of phosphoric acid, acetic acid, and nitric acid can be performed. Alternatively, by wet etching using an ammonia peroxide mixture (hydrogen peroxide:ammonia:water=5:2:2), the conductive film 132 may be etched to form the source and drain electrode layers 105a and 105b. In the etching step, part of an exposed region of the first oxide semiconductor layer 134 is etched, whereby the first oxide semiconductor layer 135 is formed. Accordingly, the first oxide semiconductor layer 135 has a region whose thickness is small between the source and drain electrode layers 105a and 105b. In FIG. 5C, the source and drain electrode layers 105a and 105b, the first oxide semiconductor layer 135, and the source and drain regions 104a and 104b are etched at one time by dry etching; therefore, end portions of the source and drain electrode layers 105a and 105b, the first oxide semiconductor layer 135, and the source and drain regions 104a and 104b are aligned with one another, and a continuous structure is formed.

In the third photolithography step, the second terminal 122 which is formed using the same material as the source and drain electrode layers 105a and 105b is left in the terminal portion. Note that the second terminal 122 is electrically connected to a source wiring (a source wiring including the source and drain electrode layers 105a and 105b).

Further, by using a resist mask which is formed using a multi-tone mask and has regions with plural thicknesses (typically, two different thicknesses), the number of resist masks can be reduced, resulting in simplified process and lower costs.

Next, the resist mask is removed, and a protective insulating layer 107 is formed to cover the gate insulating layer 102, the first oxide semiconductor layer 135, the source and drain regions 104a and 104b, and the source and drain electrode layers 105a and 105b. A silicon oxynitride film formed with a PCVD method is used as the protective insulating layer 107. The silicon oxynitride film serving as the protective insulating layer 107 is provided in contact with an exposed region of the first oxide semiconductor layer 135 between the source and drain electrode layers 105a and 105b, whereby the resistance of the region of the first oxide semiconductor layer 135 which is in contact with the protective insulating layer 107 is increased (the carrier density is reduced, preferably to lower than $1\times10^{18}/cm^3$, more preferably to lower than or equal to $1\times10^{14}/cm^3$). Thus, a semiconductor layer 103 including a channel formation region whose resistance is increased can be formed.

Figure 7:
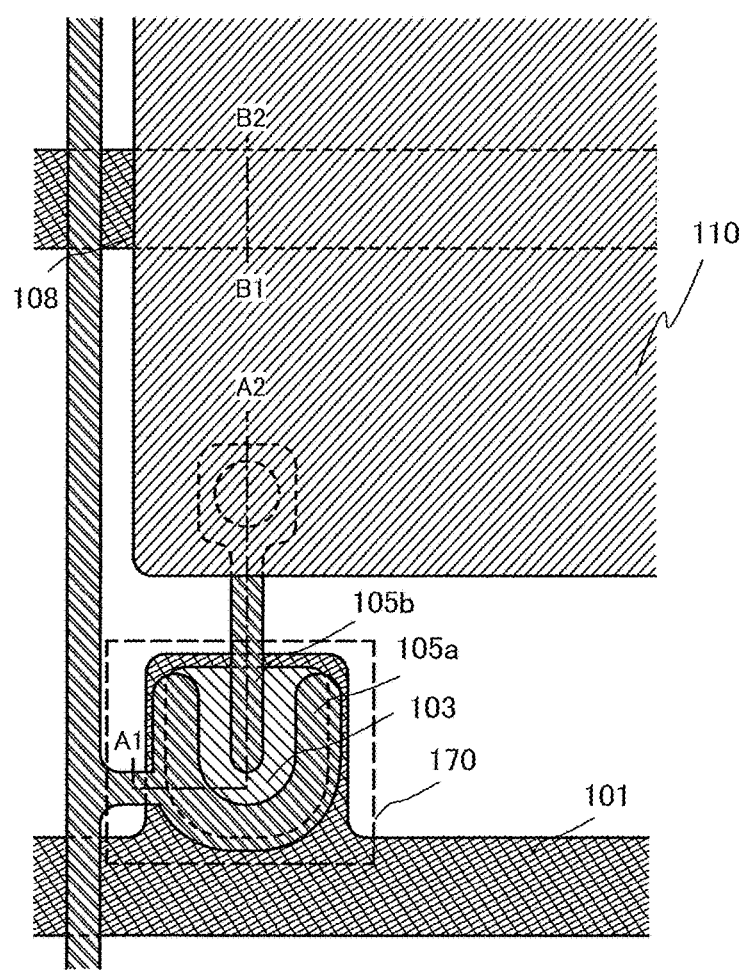
FIG. 7 illustrates a semiconductor device.

Through the above process, a thin film transistor 170 can be manufactured. Note that FIG. 7 is a plan view at this stage.

Next, a fourth photolithography step is performed. A resist mask is formed, and the protective insulating layer 107 and the gate insulating layer 102 are etched so that a contact hole 125 reaching the source or drain electrode layer 105b is formed. In addition, a contact hole 127 reaching the second terminal 122 and a contact hole 126 reaching the first terminal 121 are also formed in the same etching step. FIG. 6A is a cross-sectional view at this stage.

Next, the resist mask is removed, and then a transparent conductive film is formed. The transparent conductive film is formed using indium oxide ($In_2O_3$), indium oxide-tin oxide alloy ($In_2O_3$—$SnO_2$, abbreviated to ITO), or the like with a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—$ZnO$) may be used to improve etching processability. Alternatively, indium oxide-tin oxide alloy including silicon oxide (an In—Sn—O-based oxide including silicon oxide) may be used.

In addition, when a reflective electrode layer is used as a pixel electrode layer, it can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof.

Next, a fifth photolithography step is performed. A resist mask is formed, and unnecessary portions are removed by etching, so that a pixel electrode layer 110 is formed.

In the fifth photolithography step, a storage capacitor is formed with the capacitor wiring 108 and the pixel electrode layer 110, in which the gate insulating layer 102 and the protective insulating layer 107 in a capacitor portion are used as a dielectric.

In addition, in the fifth photolithography step, the first terminal 121 and the second terminal 122 are covered with the resist mask, and transparent conductive films 128 and 129 are left in the terminal portion. The transparent conductive films 128 and 129 function as electrodes or wirings connected to an FPC. The transparent conductive film 128 formed over the first terminal 121 is a connection terminal electrode which functions as an input terminal of a gate wiring. The transparent conductive film 129 formed over the second terminal 122 is a connection terminal electrode which functions as an input terminal of the source wiring.

Next, the resist mask is removed. FIG. 6B is a cross-sectional view at this stage.

Heat treatment may be performed after the formation of the protective insulating layer 107 or the formation of the pixel electrode layer 110. The heat treatment may be performed at higher than or equal to 150° C. and lower than 350° C. under an air atmosphere or a nitrogen atmosphere. In the heat treatment, the semiconductor layer 103 is heated while being in contact with the protective insulating layer 107; accordingly, the resistance of the semiconductor layer 103 is further increased, and thus improvement and less variation in electric characteristics of the transistor can be achieved. As for the heat treatment (preferably at higher than or equal to 150° C. and lower than 350° C.), there is no particular limitation as long as it is performed after the formation of the protective insulating layer 107. When the heat treatment also serves as another step such as heat treatment in formation of a resin film or heat treatment for reducing the resistance of a transparent conductive film, the heat treatment can be performed without increase in the number of steps.

Further, FIGS. 8A1 and 8A2 are a cross-sectional view of a gate wiring terminal portion at this stage and a plan view thereof, respectively. FIG. 8A1 is a cross-sectional view taken along line E1-E2 of FIG. 8A2. In FIG. 8A1, a transparent conductive film 155 formed over a protective insulating film 154 is a connection terminal electrode which functions as an input terminal. Furthermore, in the terminal portion of FIG. 8A1, a first terminal 151 formed using the same material as the gate wiring and a connection electrode layer 153 formed using the same material as the source wiring overlap with each other with a gate insulating layer 152 interposed therebetween, and are electrically connected to each other through the transparent conductive film 155. Note that a portion where the transparent conductive film 128 and the first terminal 121 are in contact with each other in FIG. 6B corresponds to a portion where the transparent conductive film 155 and the first terminal 151 are in contact with each other in FIG. 8A1.

FIGS. 8B1 and 8B2 are respectively a cross-sectional view and a plan view of a source wiring terminal portion which is different from that illustrated in FIG. 6B. FIG. 8B1 is a cross-sectional view taken along line F1-F2 of FIG. 8B2. In FIG. 8B1, the transparent conductive film 155 formed over the protective insulating film 154 is a connection terminal electrode which functions as an input terminal. Furthermore, in the terminal portion of FIG. 8B1, an electrode layer 156 formed using the same material as the gate wiring is located below and overlaps with a second terminal 150 which is electrically connected to the source wiring with the gate insulating layer 152 interposed therebetween. The electrode layer 156 is not electrically connected to the second terminal 150, and a capacitor for preventing noise or static electricity can be formed if the potential of the electrode layer 156 is set to a potential different from that of the second terminal 150, such as floating, GND, or 0 V. The second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

Through these five photolithography steps, the storage capacitor and a pixel thin film transistor portion including the thin film transistor 170 which is a bottom-gate thin film transistor having a staggered structure can be completed using the five photomasks. By disposing the thin film transistor and the storage capacitor in each pixel of a pixel portion in which pixels are arranged in matrix, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are fixed to each other with a liquid crystal layer interposed therebetween. Note that a common electrode which is electrically connected to the counter electrode on the counter substrate is provided over the active matrix substrate, and a fourth terminal which is electrically connected to the common electrode is provided in the terminal portion. The fourth terminal is a terminal for setting the common electrode at a fixed potential such as GND or 0 V.

Alternatively, a storage capacitor may be formed with a pixel electrode which overlaps with a gate wiring of an adjacent pixel, with a protective insulating film and a gate insulating layer interposed therebetween, without provision of the capacitor wiring.

In an active matrix liquid crystal display device, pixel electrodes arranged in matrix are driven so that a display pattern is formed on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve moving image characteristics of a liquid crystal display device, there is a driving technique called black insertion by which a black image is displayed on the whole screen every other frame period.

Alternatively, a driving technique called double-frame rate driving may be employed in which a vertical synchronizing frequency is 1.5 times or more, preferably, 2 times or more as high as a usual vertical synchronizing frequency to improve the moving-image characteristics.

Further, in order to improve moving image characteristics of a liquid crystal display device, there is another driving technique in which a surface light source including a plurality of LED (light-emitting diode) light sources or a plurality of EL light sources is used as a backlight, and each light source included in the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving technique, LEDs can be partly turned off; therefore, an effect of reducing power consumption can be obtained particularly in the case of displaying an image having a large part on which black is displayed.

By combining these driving techniques, the display characteristics of a liquid crystal display device, such as moving-image characteristics, can be improved as compared to those of conventional liquid crystal display devices.

The n-channel transistor disclosed in this specification includes an oxide semiconductor film used for a channel formation region and has favorable dynamic characteristics; thus, it can be combined with these driving techniques.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Further, in manufacturing a light-emitting display device, a power supply line is provided in addition to a source wiring and a gate wiring. Accordingly, the terminal portion is provided with a fifth terminal which is electrically connected to the power supply line.

In manufacturing a light-emitting display device, a partition wall including an organic resin layer is provided between organic light-emitting elements in some cases. In that case, heat treatment performed on the organic resin layer can also serve as the heat treatment which increases the resistance of the semiconductor layer 103 so that improvement and less variation in electric characteristics of the transistor are achieved.

The use of an oxide semiconductor for a thin film transistor leads to reduction in manufacturing cost. In particular, by the heat treatment for dehydration or dehydrogenation, impurities such as moisture are reduced and the purity of the oxide semiconductor film is increased. Therefore, a semiconductor device including a highly reliable thin film transistor having favorable electric characteristics can be manufactured without using an ultrapure oxide semiconductor target or a special sputtering apparatus in which dew point in a film-formation chamber is reduced.

Since the semiconductor layer in the channel formation region is a region whose resistance is increased, electric characteristics of the thin film transistor are stabilized, and increase in off current or the like can be prevented. Accordingly, a semiconductor device including the highly reliable thin film transistor having favorable electric characteristics can be provided.

This embodiment can be implemented in appropriate combination with any of the structures described in the other embodiments.

Embodiment 5

An example will be described below, in which at least part of a driver circuit and a thin film transistor arranged in a pixel portion are formed over the same substrate in a display device which is one example of a semiconductor device.

The thin film transistor to be disposed in the pixel portion is formed in accordance with any of Embodiments 1 to 4. Further, the thin film transistor described in any of Embodiments 1 to 4 is an n-channel TFT, and thus part of a driver circuit that can include an n-channel TFT among driver circuits is formed over the same substrate as the thin film transistor of the pixel portion.

Figure 14A:
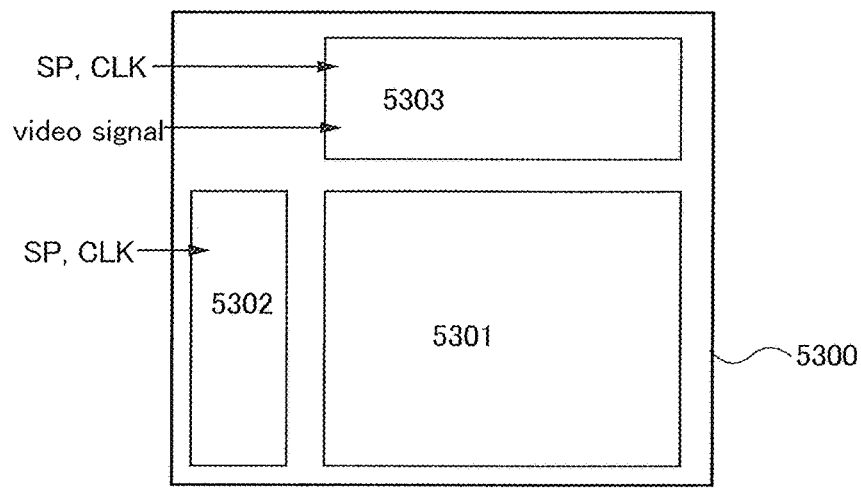
FIGS. 14A and 14B are block diagrams of semiconductor devices.

FIG. 14A illustrates an example of a block diagram of an active matrix liquid crystal display device which is an example of a semiconductor device. The display device illustrated in FIG. 14A includes, over a substrate 5300, a pixel portion 5301 including a plurality of pixels that are each provided with a display element, a scan line driver circuit 5302 that selects each pixel, and a signal line driver circuit 5303 that controls a video signal input to the selected pixel.

The pixel portion 5301 is connected to the signal line driver circuit 5303 by a plurality of signal lines S1 to Sm (not illustrated) which extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gi (one of the scan lines G1 to Gn).

In addition, the thin film transistor described in any of Embodiments 1 to 4 is an n-channel TFT, and a signal line driver circuit including the n-channel TFT is described with reference to FIG. 15.

Figure 15:
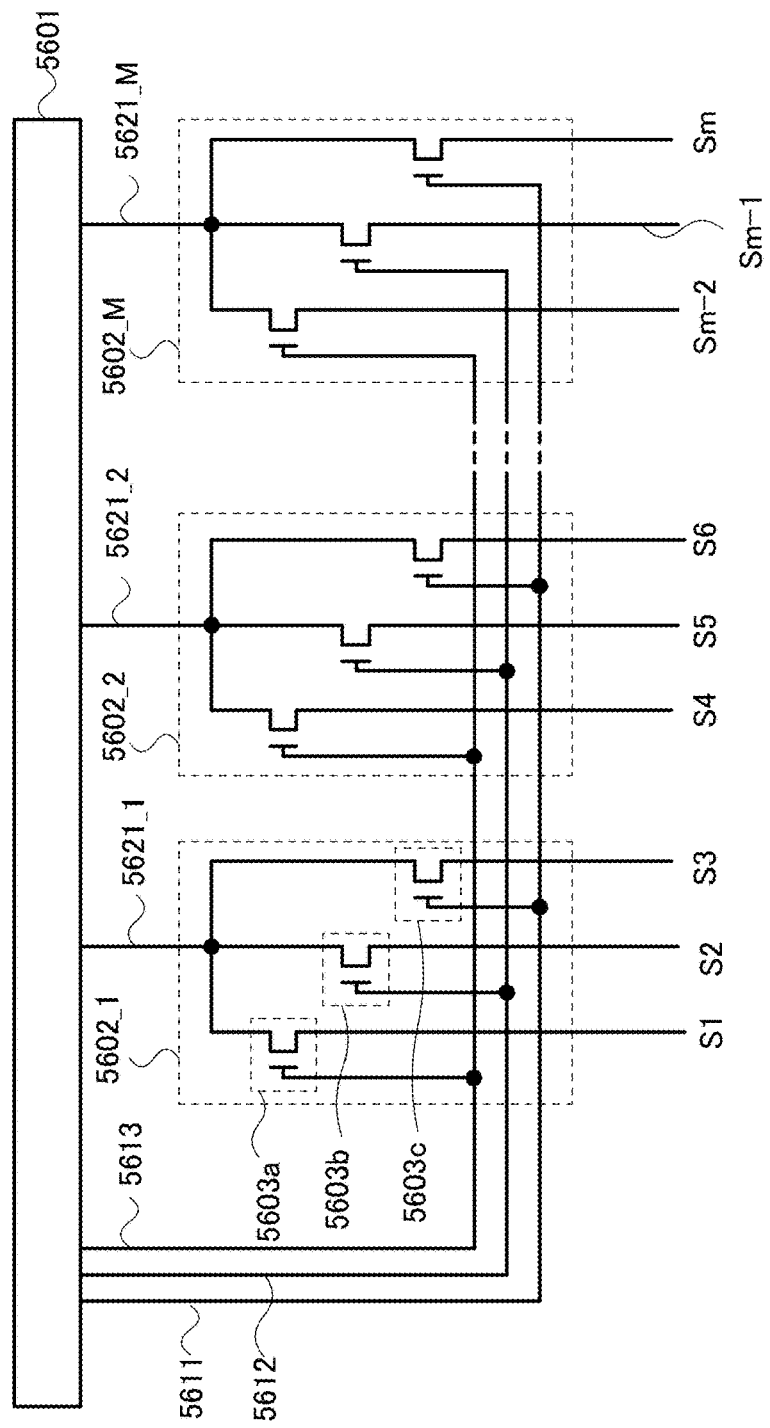
FIG. 15 illustrates a configuration of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c which are included in the switch group 5602_J.

A signal is inputted to each of the first wiring 5611, the second wiring 5612, and the third wiring 5613.

Note that the driver IC 5601 is preferably formed over a single crystal substrate. Further, the switch groups 5602_1 to 5602_M are preferably formed over the same substrate as the pixel portion. Therefore, the driver IC 5601 and the switch groups 5602_1 to 5602_M are preferably connected through an FPC or the like.

Figure 16:
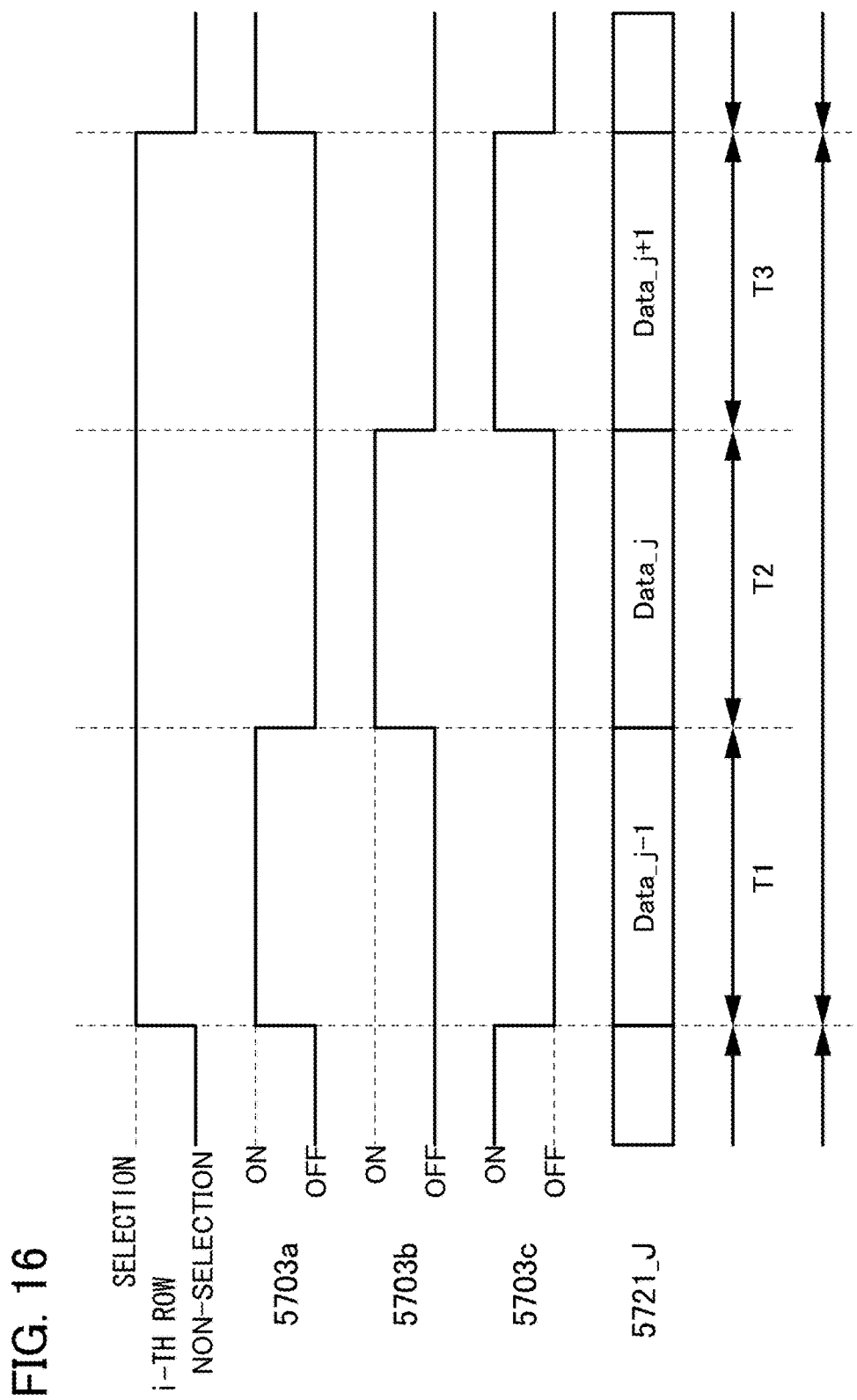
FIG. 16 is a timing chart illustrating operation of a signal line driver circuit.

Next, operation of the signal line driver circuit illustrated in FIG. 15 is described with reference to a timing chart in FIG. 16. The timing chart in FIG. 16 illustrates the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 15 operates similarly to that in FIG. 16 even when a scan line of another row is selected.

Note that the timing chart in FIG. 16 illustrates the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

Note that the timing chart in FIG. 16 illustrates timing at which the scan line Gi of the i-th row is selected, timing 5703a at which the first thin film transistor 5603a is turned on/off, timing 5703b at which the second thin film transistor 5603b is turned on/off, timing 5703c at which the third thin film transistor 5603c is turned on/off, and a signal 5721_J inputted to the wiring 5621_J of the J-th column.

In the first sub-selection period T1, the second sub-selection period T2, and the third sub-selection period T3, different video signals are inputted to the wirings 5621_1 to 5621_M. For example, a video signal inputted to the wiring 5621_J in the first sub-selection period T1 is inputted to the signal line Sj−1, a video signal inputted to the wiring 5621_J in the second sub-selection period T2 is inputted to the signal line Sj, and a video signal inputted to the wiring 5621_J in the third sub-selection period T3 is inputted to the signal line Sj+1. In addition, the video signals inputted to the wiring 5621_J in the first sub-selection period T1, the second sub-selection period T2, and the third sub-selection period T3 are denoted by Data_j−1, Data_j, and Data_j+1.

As illustrated in FIG. 16, in the first sub-selection period T1, the first thin film transistor 5603a is turned on, and the second thin film transistor 5603b and the third thin film transistor 5603c are turned off. At this time, Data_j−1 inputted to the wiring 5621_J is inputted to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j inputted to the wiring 5621_J is inputted to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 inputted to the wiring 5621_J is inputted to the signal line Sj+1 via the third thin film transistor 5603c.

As described above, in the signal line driver circuit in FIG. 15, by dividing one gate selection period into three, video signals can be inputted to three signal lines from one wiring 5621 in one gate selection period. Therefore, in the signal line driver circuit in FIG. 15, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 15 can be improved.

Note that there is no particular limitation on the arrangement, the number, a driving method, and the like of the thin film transistors, as long as one gate selection period is divided into a plurality of sub-selection periods and video signals are inputted to a plurality of signal lines from one wiring in the respective sub-selection periods as illustrated in FIG. 15.

For example, when video signals are inputted to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
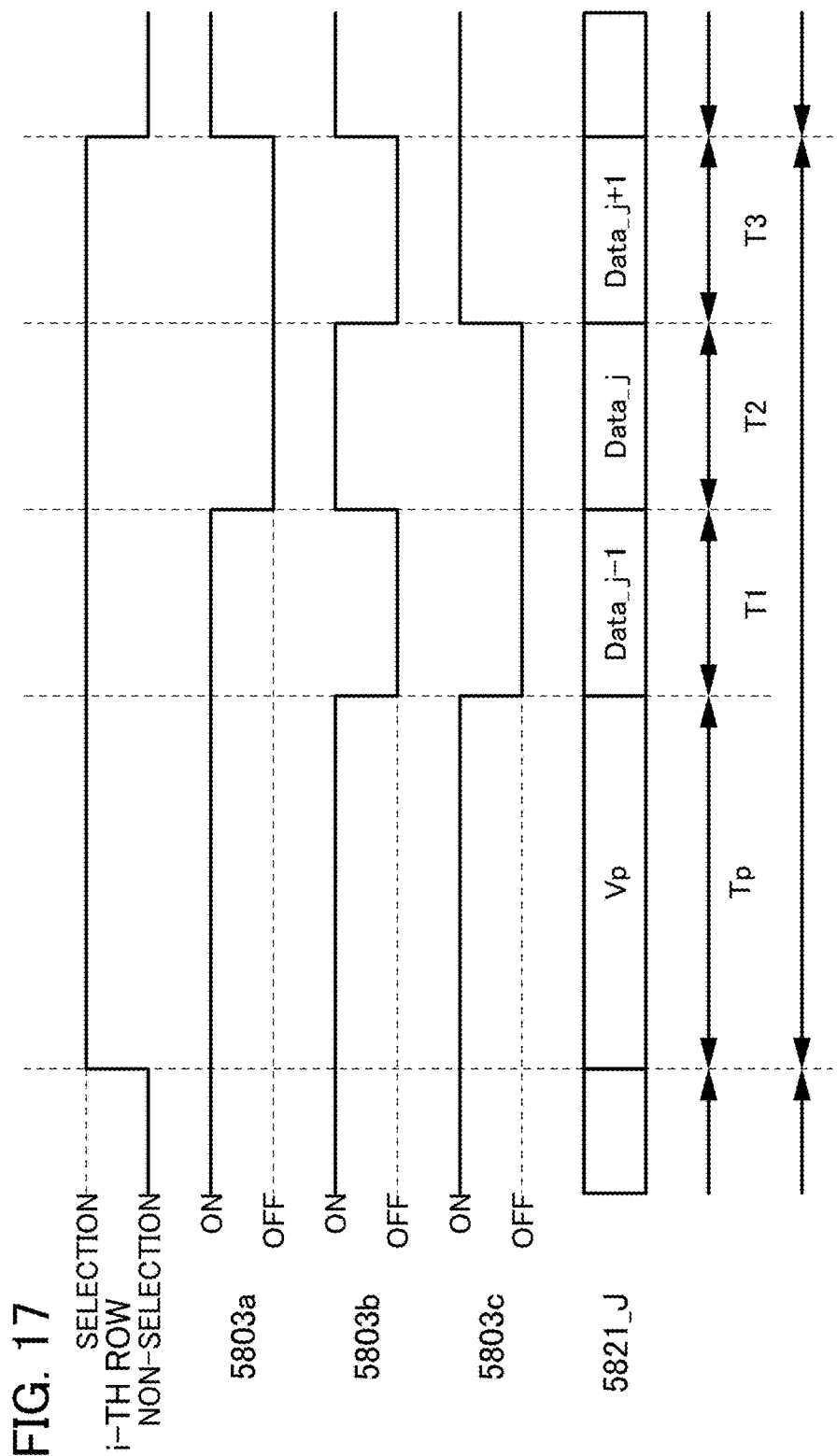
FIG. 17 is a timing chart illustrating operation of a signal line driver circuit.

As another example, one gate selection period may be divided into a precharge period Tp, the first sub-selection period T1, the second sub-selection period T2, and the third sub-selection period T3 as illustrated in a timing chart in FIG. 17. Further, the timing chart in FIG. 17 illustrates the timing at which the scan line Gi of the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821_J inputted to the wiring 5621_J of the J-th column. As illustrated in FIG. 17, the first thin film transistor 5603a, the second thin film transistor 5603b, and the third thin film transistor 5603c are turned on in the precharge period Tp. At this time, precharge voltage $V_p$ inputted to the wiring 5621_J is inputted to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 inputted to the wiring 5621_J is inputted to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j inputted to the wiring 5621_J is inputted to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 inputted to the wiring 5621_J is inputted to the signal line Sj+1 via the third thin film transistor 5603c.

As described above, in the signal line driver circuit in FIG. 15 to which the timing chart in FIG. 17 is applied, the video signal can be written to the pixel at high speed because the signal line can be precharged by providing a precharge period before a sub-selection period. Note that portions of FIG. 17 which are similar to those of FIG. 16 are denoted by common reference numerals and detailed description of the same portions and portions having similar functions is omitted.

Further, a configuration of a scan line driver circuit is described. The scan line driver circuit includes a shift register. Additionally, the scan line driver circuit may include a level shifter or a buffer in some cases. In the scan line driver circuit, when a clock signal (CLK) and a start pulse signal (SP) are inputted to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply large current is used.

One mode of a shift register used for part of the scan line driver circuit will be described with reference to FIG. 18 and FIG. 19.

Figure 18:
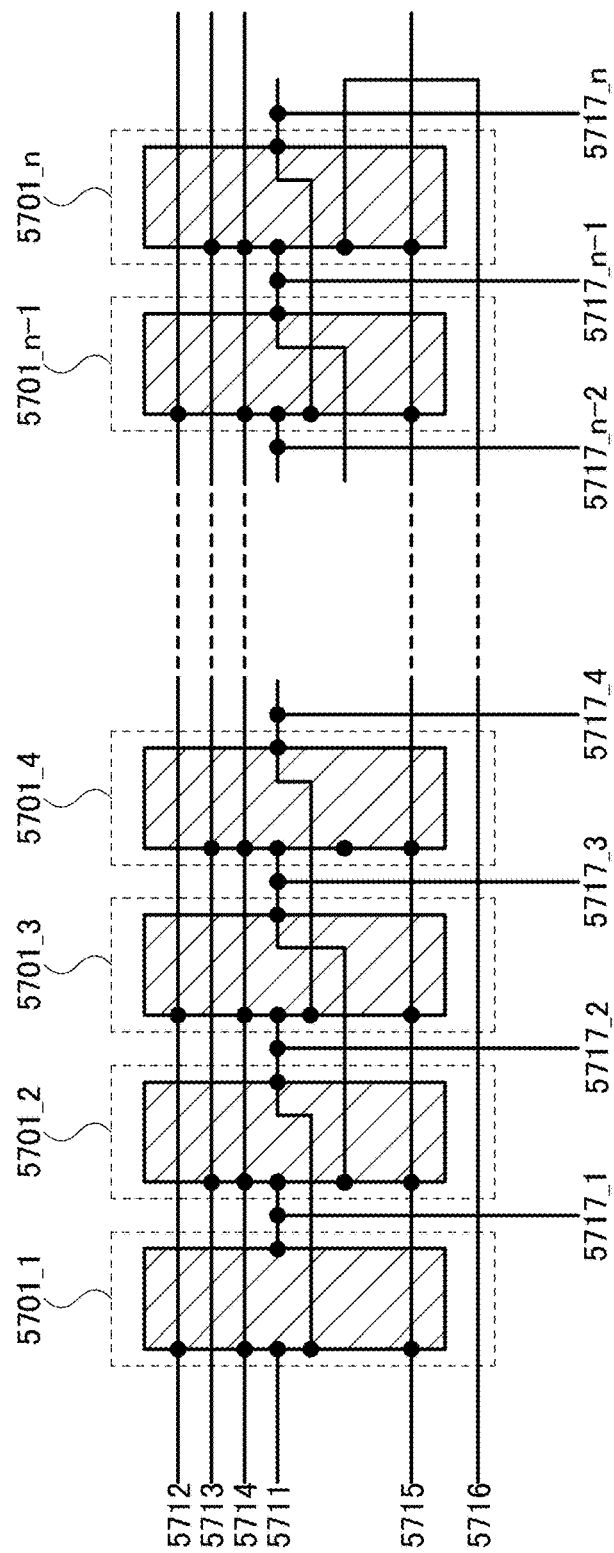
FIG. 18 illustrates a configuration of a shift register.

FIG. 18 illustrates a circuit configuration of the shift register. The shift register illustrated in FIG. 18 includes a plurality of flip-flops: flip-flops 5701_1 to 5701_n. The shift register is operated with input of a first clock signal, a second clock signal, a start pulse signal, and a reset signal.

The connection relationship of the shift register in FIG. 18 will be described. In the i-th stage flip-flop 5701_i (one of the flip-flops 5701_1 to 5701_n) in the shift register in FIG. 18, a first wiring 5501 illustrated in FIG. 19 is connected to a seventh wiring 5717_i−1, a second wiring 5502 illustrated in FIG. 19 is connected to a seventh wiring 5717_i+1, a third wiring 5503 illustrated in FIG. 19 is connected to a seventh wiring 5717_i, and a sixth wiring 5506 illustrated in FIG. 19 is connected to a fifth wiring 5715.

Figure 19:
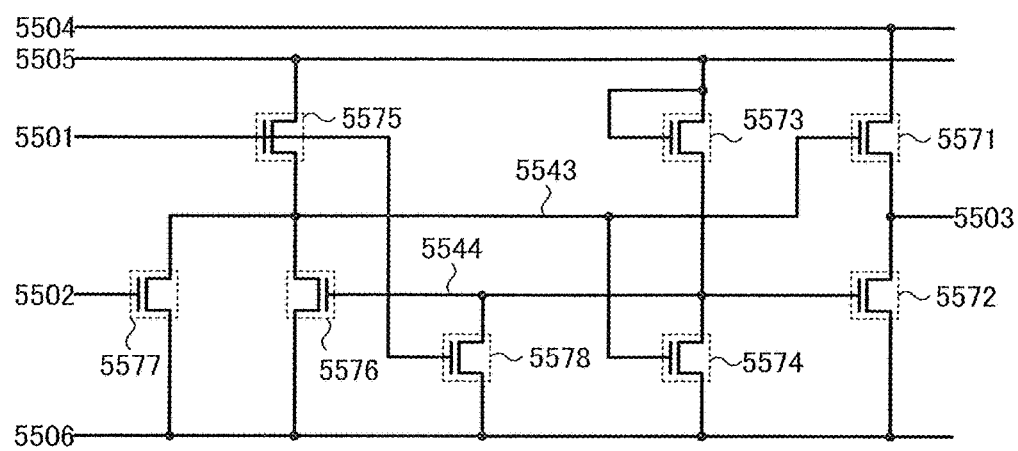
FIG. 19 illustrates a connection structure of the flip-flop illustrated in FIG. 18.

Further, a fourth wiring 5504 illustrated in FIG. 19 is connected to a second wiring 5712 in flip-flops of odd-numbered stages, and is connected to a third wiring 5713 in flip-flops of even-numbered stages. A fifth wiring 5505 illustrated in FIG. 19 is connected to a fourth wiring 5714.

Note that the first wiring 5501 of the first stage flip-flop 5701_1 which is illustrated in FIG. 19 is connected to a first wiring 5711. Moreover, the second wiring 5502 of the n-th stage flip-flop 5701_*n* which is illustrated in FIG. 19 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 19 illustrates details of the flip-flop shown in FIG. 18. A flip-flop illustrated in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, a connection configuration of the flip-flop illustrated in FIG. 19 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506, and a second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505, and a second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506, and a second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506, and a second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506, and a second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. Further, the point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in any of Embodiments 1 to 4. The n-channel TFT described in any of Embodiments 1 to 4 have a high mobility, and thus a driving frequency of the driver circuits can be increased. Further, since parasitic capacitance is reduced in the n-channel TFT described in any of Embodiments 1 to 4, high frequency characteristics (referred to as f characteristics) is obtained. For example, a scan line driver circuit using the n-channel TFT described in any of Embodiments 1 to 4 can operate at high speed, and thus a frame frequency can be increased and insertion of black images can be realized, for example.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, increase in frame frequency can be realized. Furthermore, the use of the plurality of scan line driver circuits for output of signals to the same scan line is advantageous in increasing the size of a display device.

Figure 14B:
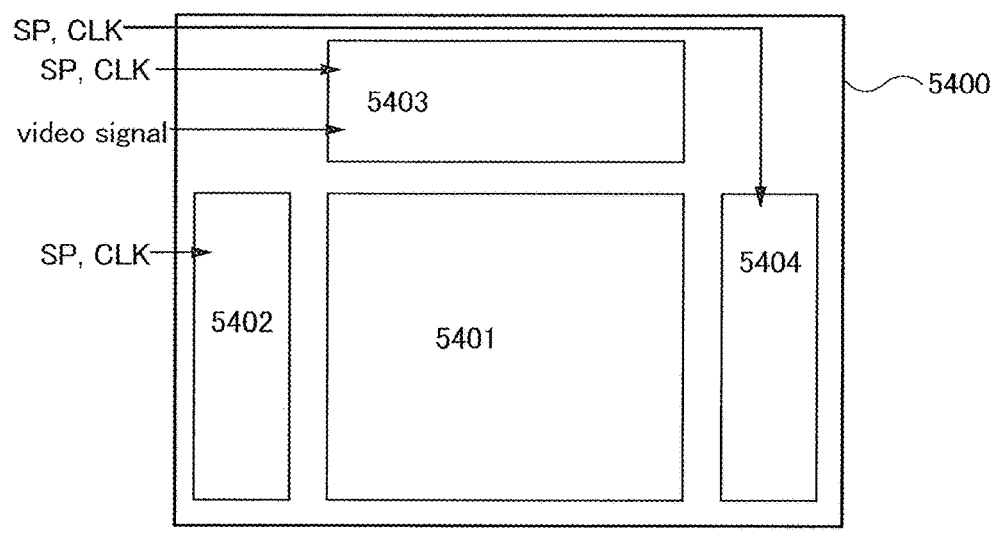

Further, when an active matrix light-emitting display device which is an example of a semiconductor device is manufactured, a plurality of thin film transistors are arranged in at least one pixel, and thus a plurality of scan line driver circuits are preferably arranged. FIG. 14B illustrates an example of a block diagram of an active matrix light-emitting display device.

The light-emitting display device illustrated in FIG. 14B includes, over a substrate 5400, a pixel portion 5401 including a plurality of pixels each provided with a display element, a first scan line driver circuit 5402 and a second scan line driver circuit 5404 that select each pixel, and a signal line driver circuit 5403 that controls a video signal input to the selected pixel.

When the video signal inputted to a pixel of the light-emitting display device illustrated in FIG. 14B is a digital signal, a pixel emits light or does not emit light by switching a transistor on/off. Thus, grayscale can be displayed using an area grayscale method or a time grayscale method. An area grayscale method refers to a driving method in which one pixel is divided into a plurality of sub-pixels and the respective sub-pixels are driven independently based on video signals so that grayscale is displayed. Further, a time grayscale method refers to a driving method in which a period during which a pixel emits light is controlled so that grayscale is displayed.

Since the response speed of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of sub-frame periods. Then, in accordance with video signals, the light-emitting element in the pixel is brought into a light-emitting state or a non-light-emitting state in each sub-frame period. By dividing one frame period into a plurality of sub-frame periods, the total length of time, in which a pixel actually emits light in one frame period, can be controlled by video signals so that grayscale can be displayed.

Note that in the example of the light-emitting display device illustrated in FIG. 14B, when two switching TFTs are arranged in one pixel, the first scan line driver circuit 5402 generates a signal which is inputted to a first scan line serving as a gate wiring of one of the two switching TFTs, and the second scan line driver circuit 5404 generates a signal which is inputted to a second scan line serving as a gate wiring of the other of the two switching TFTs. However, one scan line driver circuit may generate both the signal which is inputted to the first scan line and the signal which is inputted to the second scan line. In addition, for example, a possibility that a plurality of scan lines used to control the operation of the switching element are provided in each pixel depending on the number of the switching TFTs included in one pixel. In this case, one scan line driver circuit may generate all signals that are inputted to the plurality of scan lines, or a plurality of scan line driver circuits may generate signals that are inputted to the plurality of scan lines.

Also in the light-emitting display device, part of a driver circuit that can include an n-channel TFT among driver circuits can be formed over the same substrate as the thin film transistors of the pixel portion. Alternatively, the signal line driver circuit and the scan line driver circuit can be formed using only the n-channel TFTs described in any of Embodiments 1 to 4.

Through the above process, a highly reliable display device as a semiconductor device can be manufactured.

This embodiment can be implemented in appropriate combination with any of the structures described in the other embodiments.

Embodiment 6

When a thin film transistor is manufactured and used for a pixel portion and further for a driver circuit, a semiconductor device having a display function (also referred to as a display device) can be manufactured. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. An embodiment of the present invention also relates to an element substrate which corresponds to one mode before the display element is completed in a manufacturing process of the display device, and the element substrate is provided with a unit for supplying current to the display element in each of a plurality of pixels. Specifically, the element substrate may be in a state where only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element with a chip on glass (COG) method.

The appearance and cross section of a liquid crystal display panel which is one embodiment of a semiconductor device will be described with reference to FIGS. 10A1, 10A2 and 10B. FIGS. 10A1 and 10A2 are each a plan view of a panel in which a liquid crystal element 4013 and highly reliable thin film transistors 4010 and 4011 each including the oxide semiconductor layer, which are like the thin film transistor described in Embodiment 4, which are formed over a first substrate 4001 are sealed between the first substrate 4001 and a second substrate 4006 with a sealant 4005. FIG. 10B is a cross-sectional view taken along line M-N of FIGS. 10A1 and 10A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 10A1 illustrates an example of mounting the signal line driver circuit 4003 with a COG method, and FIG. 10A2 illustrates an example of mounting the signal line driver circuit 4003 with a TAB method.

The pixel portion 4002 and the scan line driver circuit 4004 provided over the first substrate 4001 each include a plurality of thin film transistors, and FIG. 10B illustrates an example of the thin film transistor 4010 included in the pixel portion 4002 and the thin film transistor 4011 included in the scan line driver circuit 4004. Insulating layers 4020 and 4021 are provided over the thin film transistors 4010 and 4011.

As the thin film transistors 4010 and 4011, a highly reliable thin film transistor including oxide semiconductor layer like the thin film transistor described in Embodiment 4 can be employed. Alternatively, the thin film transistor described in any of Embodiments 1 to 3 may be employed. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may also be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are contained in the sealant 4005.

Alternatively, liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes liquid crystal exhibiting a blue phase and a chiral agent has a short response speed of 1 msec or less, has optical isotropy, which makes the alignment process unneeded, and has a small viewing angle dependence.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked-layer structure of the polarizing plate and the coloring layer is not limited to that described in this embodiment and may be set as appropriate in a manner that depends on materials of the polarizing plate and the coloring layer or conditions of manufacturing steps. Furthermore, a light-blocking film serving as a black matrix may be provided.

In the thin film transistors 4010 and 4011, the insulating layer 4020 is formed as a protective insulating film so as to be in contact with a semiconductor layer including a channel formation region. The insulating layer 4020 may be formed using a material and a method similar to those of the oxide insulating film 407 described in Embodiment 1. In addition, in order to reduce the surface roughness of the thin film transistors, the thin film transistors are covered with the insulating layer 4021 serving as a planarizing insulating film.

In this embodiment, the insulating layer 4020 having a stacked-layer structure is formed as the protective film. As a first layer of the insulating layer 4020, a silicon oxide film is formed with a sputtering method. The use of the silicon oxide film as the protective film has the effect of preventing a hillock of an aluminum film used for the source and drain electrode layers.

An insulating layer is formed as a second layer of the protective film. As a second layer of the insulating layer 4020, a silicon nitride film is formed with a sputtering method. The use of the silicon nitride film as the protective film can prevent mobile ions such as sodium ions from entering a semiconductor region, thereby suppressing variations in electric characteristics of the TFTs.

After the protective film is formed, heat treatment (at 300° C. or less) may be performed under a nitrogen atmosphere or an air atmosphere.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

Note that a siloxane-based resin is a resin formed from a siloxane-based material as a starting material and having a Si—O—Si bond. The siloxane-based resin may include an organic group (e.g., an alkyl group or an aryl group) or a fluoro group as a substituent. The organic group may include a fluoro group.

There is no particular limitation on the method for forming the insulating layer 4021, and any of the following can be used depending on a material thereof: a method such as a sputtering method, an SOG method, spin coating, dipping, spray coating, or a droplet discharging method (e.g., an ink-jet method, screen printing, or offset printing); a tool such as doctor knife, roll coater, curtain coater, or knife coater; or the like. The baking step of the insulating layer 4021 also serves as the annealing step of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm. Furthermore, the resistivity of the conductive macromolecule contained in the conductive composition is preferably 0.1 Ω·cm or less.

As the conductive macromolecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied from an FPC 4018 to the signal line driver circuit 4003 that is formed separately, and the scan line driver circuit 4004 or the pixel portion 4002.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 10A1, 10A2 and 10B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 20:
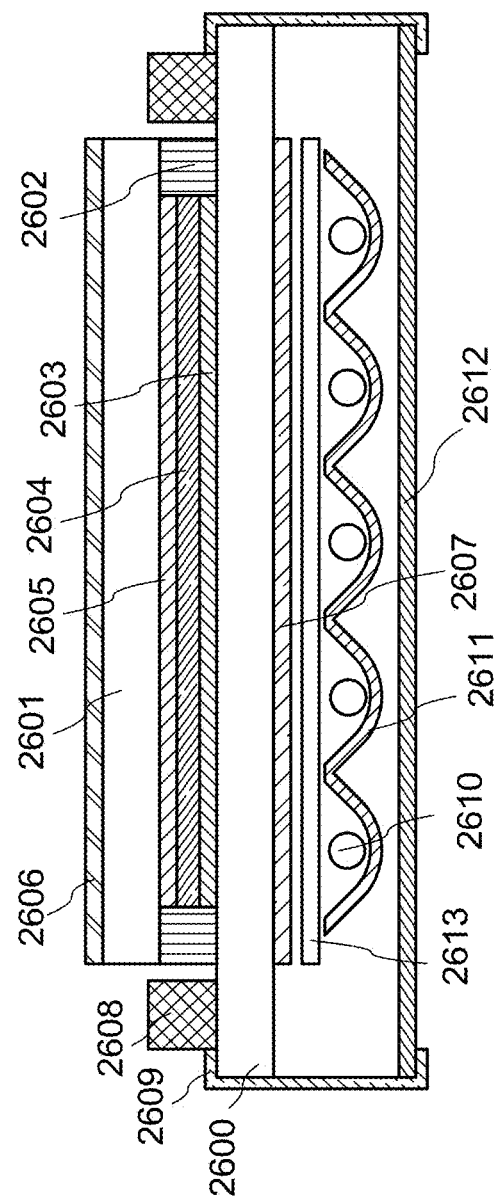
FIG. 20 illustrates a semiconductor device.

FIG. 20 illustrates an example of a liquid crystal display module which is formed as a semiconductor device by using a TFT substrate 2600 manufactured in accordance with the manufacturing method disclosed in this specification.

FIG. 20 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

This embodiment can be implemented in appropriate combination with any of the structures described in the other embodiments.

Embodiment 7

An example of electronic paper will be described as a semiconductor device.

The semiconductor device can be used for electronic paper that drives electronic using an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By application of an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

An electrophoretic display is thus a display that utilizes a so-called dielectrophoretic effect by which a substance having a high dielectric constant moves to a high-electric field region. An electrophoretic display does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and thus display can be performed by application of an electric field to the microcapsules. For example, the active matrix substrate obtained using the thin film transistor described in any of Embodiments 1 to 4 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

Figure 9:
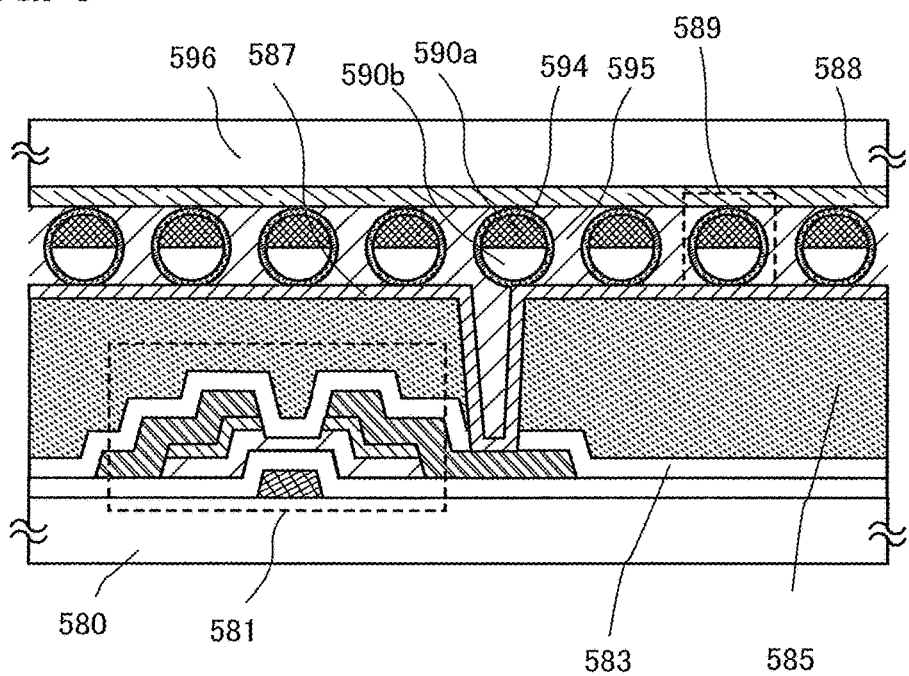
FIG. 9 illustrates a semiconductor device.

FIG. 9 illustrates active matrix electronic paper as an example of the semiconductor device. A thin film transistor 581 used for the semiconductor device can be manufactured in a manner similar to that of the thin film transistor described in Embodiment 1 and is a highly reliable thin film transistor including an oxide semiconductor layer. The thin film transistor described in any of Embodiments 2 to 4 can also be used as the thin film transistor 581 of this embodiment.

The electronic paper in FIG. 9 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor having a bottom-gate structure and is covered with an insulating film 583 that is in contact with the semiconductor layer. A source or drain electrode layer of the thin film transistor 581 is in contact with a first electrode layer 587 through an opening formed in the insulating film 583 and an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 which is filled with liquid around the black region 590a and the white region 590b are provided. A space around the spherical particles 589 is filled with a filler 595 such as a resin (see FIG. 9). The first electrode layer 587 corresponds to a pixel electrode, and the second electrode layer 588 corresponds to a common electrode. The second electrode layer 588 is electrically connected to a common potential line provided over the same substrate 580 as the thin film transistor 581. With the use of a common connection portion, the second electrode layer 588 can be electrically connected to the common potential line through conductive particles provided between the substrate 580 and the substrate 596.

Instead of the twisting ball, an electrophoretic element can also be used. A microcapsule having a diameter of approximately 10 μm to 200 μm in which transparent liquid, positively-charged white microparticles, and negatively-charged black microparticles are encapsulated is used. In the microcapsule which is provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through above process, highly reliable electronic paper as a semiconductor device can be manufactured.

This embodiment can be implemented in appropriate combination with any of the structures described in the other embodiments.

Embodiment 8

An example of a light-emitting display device will be described as the semiconductor device. As a display element included in the display device, a light-emitting element utilizing electroluminescence is described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 12:
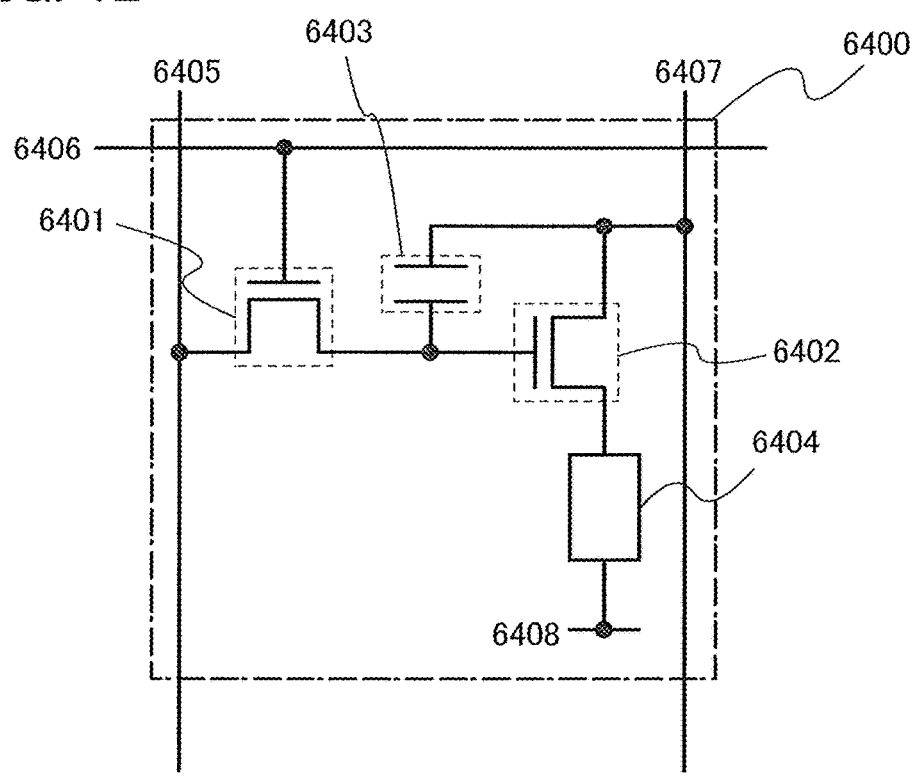
FIG. 12 illustrates a pixel equivalent circuit of a semiconductor device.

FIG. 12 illustrates an example of a pixel configuration to which digital time grayscale driving can be applied as an example of the semiconductor device.

The configuration and operation of a pixel to which digital time grayscale driving can be applied will be described. An example is described in this embodiment in which one pixel includes two n-channel transistors using an oxide semiconductor layer in a channel formation region.

A pixel 6400 includes a switching transistor 6401, a driving transistor 6402, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the driving transistor 6402. In the driving transistor 6402, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. Note that the low power supply potential is a potential satisfying the low power supply potential<a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between the channel region and the gate electrode.

In the case of using a voltage-input voltage driving method, a video signal is inputted to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage+$V_{th}$ of the driving transistor 6402.

In the case of performing analog grayscale driving instead of digital time grayscale driving, the same pixel configuration as FIG. 12 can be employed by inputting signals in a different way.

In the case of performing analog grayscale driving, voltage higher than or equal to the following is applied to the gate of the driving transistor 6402: forward voltage of the light-emitting element 6404+$V_{th}$ of the driving transistor 6402. The forward voltage of the light-emitting element 6404 refers to voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than a gate potential of the driving transistor 6402. When an analog video signal is used, it is possible to feed current to the light-emitting element 6404 in accordance with the video signal and perform analog grayscale driving.

Note that the pixel configuration is not limited to that illustrated in FIG. 12. For example, the pixel illustrated in FIG. 12 may further include a switch, a resistor, a capacitor, a transistor, a logic circuit, or the like.

Next, structures of the light-emitting element will be described with reference to FIGS. 13A to 13C. A cross-sectional structure of a pixel will be described by taking an n-channel driving TFT as an example. Driving TFTs 7001, 7011, and 7021 used for semiconductor devices illustrated in FIGS. 13A, 13B, and 13C, respectively, can be manufactured in a manner similar to that of the thin film transistor described in Embodiment 1 and are highly reliable thin film transistors each including an oxide semiconductor layer. Alternatively, the thin film transistors described in any of Embodiment 2 to 4 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration can be applied to a light-emitting element having any of these emission structures.

A light-emitting element having a top emission structure will be described with reference to FIG. 13A.

Figure 13A:
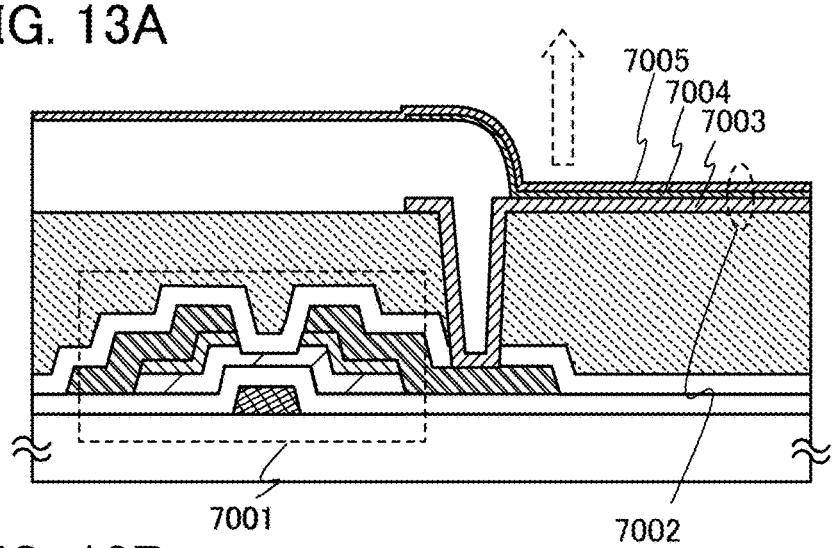
FIGS. 13A to 13C illustrate semiconductor devices.

FIG. 13A is a cross-sectional view of a pixel in the case where the driving TFT 7001 is an n-channel TFT and light is emitted from a light-emitting element 7002 to an anode 7005 side. In FIG. 13A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed as a single layer or a plurality of layers stacked. When the light-emitting layer 7004 is formed as a plurality of layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided. The anode 7005 may be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 13A, light is emitted from the light-emitting element 7002 to the anode 7005 side as indicated by an arrow.

Next, a light-emitting element having a bottom emission structure will be described with reference to FIG. 13B. FIG. 13B is a cross-sectional view of a pixel in the case where the driving TFT 7011 is an n-channel TFT and light is emitted from a light-emitting element 7012 to a cathode 7013 side. In FIG. 13B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. As in the case of FIG. 13A, the cathode 7013 can be formed using a variety of conductive materials as long as they have a low work function. Note that the cathode 7013 is formed to have a thickness that can transmit light (preferably, approximately 5 nm to 30 nm). For example, an aluminum film with a thickness of 20 nm can be used as the cathode 7013. As in the case of FIG. 13A, the light-emitting layer 7014 may be formed using either a single layer or a plurality of layers stacked. The anode 7015 is not required to transmit light, but can be formed using a light-transmitting conductive material as in the case of FIG. 13A. As the light-blocking film 7016, a metal which reflects light can be used for example; however, the light-blocking film 7016 is not limited to a metal film. For example, a resin to which black pigments are added can also be used.

The light-emitting element 7012 corresponds to a region where the light-emitting layer 7014 is sandwiched between the cathode 7013 and the anode 7015. In the case of the pixel illustrated in FIG. 13B, light is emitted from the light-emitting element 7012 to the cathode 7013 side as indicated by an arrow.

Next, a light-emitting element having a dual emission structure will be described with reference to FIG. 13C. In FIG. 13C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 13A, the cathode 7023 can be formed using a variety of conductive materials as long as they have a low work function. Note that the cathode 7023 is formed to have a thickness that can transmit light. For example, an aluminum film with a thickness of 20 nm can be used as the cathode 7023. As in FIG. 13A, the light-emitting layer 7024 may be formed using either a single layer or a plurality of layers stacked. The anode 7025 can be formed using a light-transmitting conductive material as in the case of FIG. 13A.

The light-emitting element 7022 corresponds to a region where the cathode 7023, the light-emitting layer 7024, and the anode 7025 overlap with one another. In the case of the pixel illustrated in FIG. 13C, light is emitted from the light-emitting element 7022 to both the anode 7025 side and the cathode 7023 side as indicated by arrows.

Although an organic EL element is described in this embodiment as a light-emitting element, an inorganic EL element can also be provided as a light-emitting element.

Note that although the example is described in which a thin film transistor (a driving TFT) which controls the driving of a light-emitting element is electrically connected to the light-emitting element, a structure may be employed in which a TFT for current control is connected between the driving TFT and the light-emitting element.

Figure 13B:
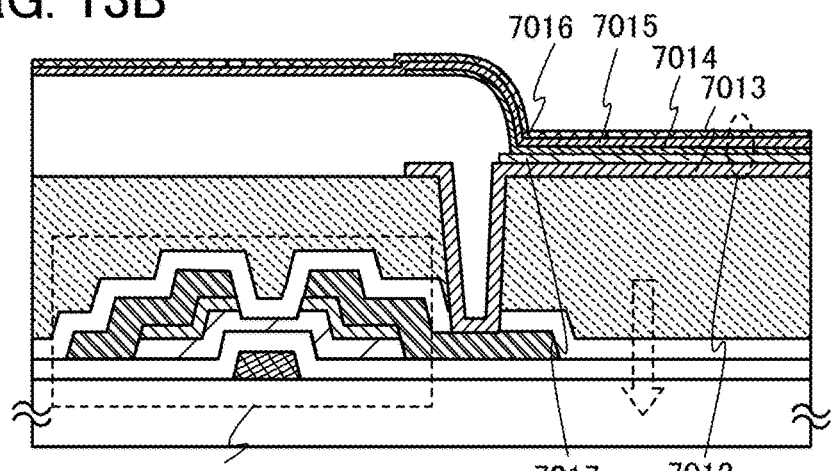
Figure 13C:
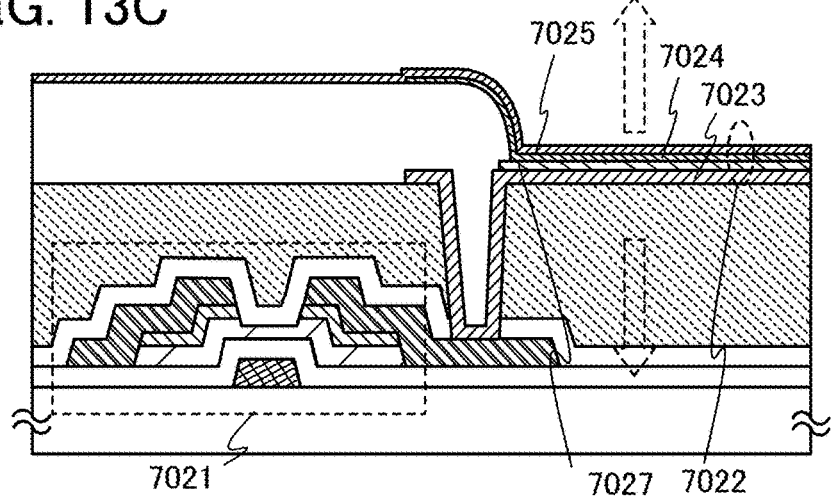

Note that the structure of the semiconductor device described in this embodiment is not limited to those illustrated in FIGS. 13A to 13C and can be modified in various ways based on the spirit of techniques disclosed in this specification.

Figure 11A:
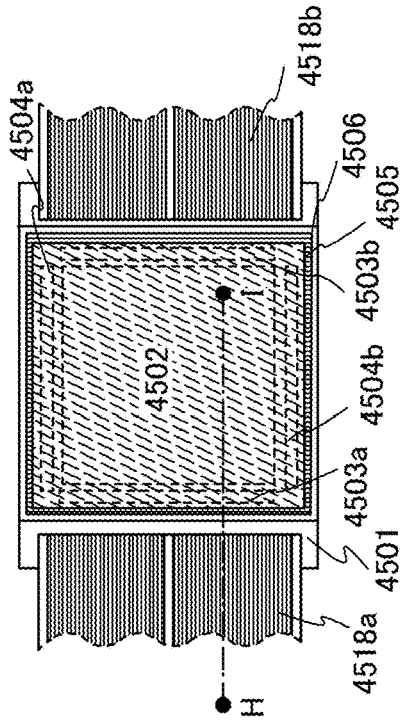
FIGS. 11A and 11B illustrate a semiconductor device.
Figure 11B:
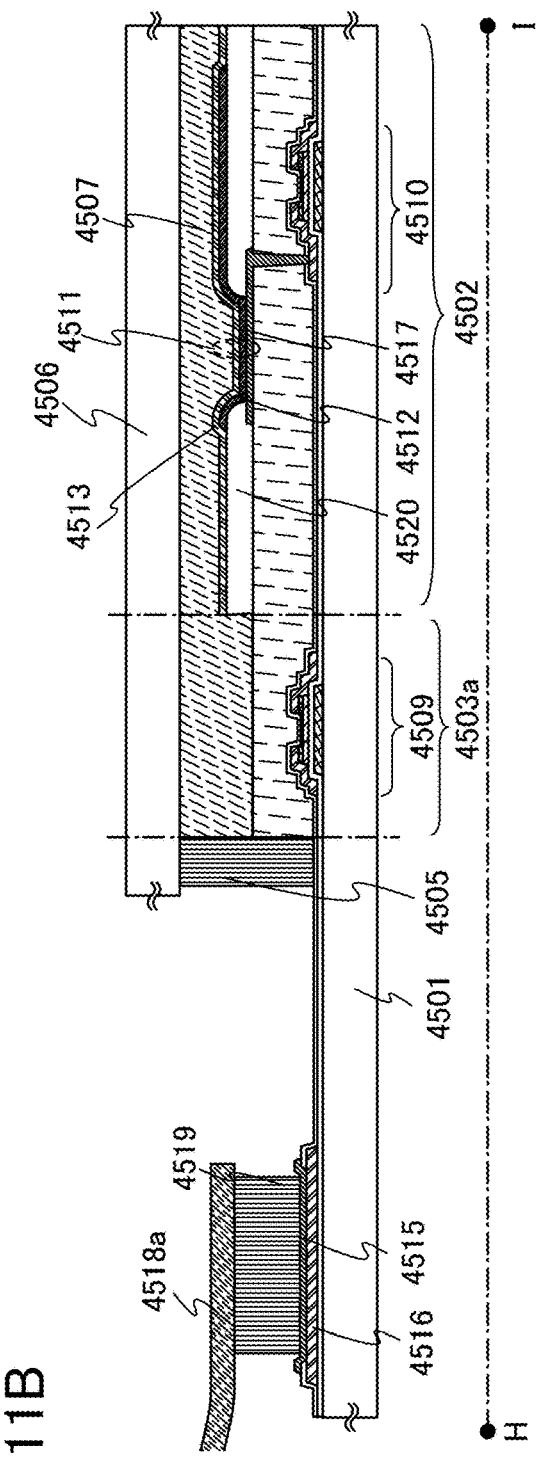

Next, the appearance and cross section of a light-emitting display panel (also referred to as a light-emitting panel), which is one embodiment of the semiconductor device, will be described with reference to FIGS. 11A and 11B. FIG. 11A is a plan view of a panel in which a thin film transistor and a light-emitting element formed over a first substrate are sealed between the first substrate and a second substrate with a sealant. FIG. 11B is a cross-sectional view taken along line H-I of FIG. 11A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that packaging (sealing) be thus performed with a protective film (such as a bonding film or an ultraviolet curable resin film) or a cover material with high air-tightness and little degasification so that the display device is not thus exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 11B.

As the thin film transistors 4509 and 4510, the highly reliable thin film transistor including an oxide semiconductor layer, which is described in Embodiment 3, can be employed. Alternatively, the thin film transistor described in any of Embodiments 1 to 4 can be employed. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source or drain electrode layer of the thin film transistor 4510. Note that a structure of the light-emitting element 4511 is not limited to the stacked-layer structure described in this embodiment, which includes the first electrode layer 4517, an electroluminescent layer 4512, and a second electrode layer 4513. The structure of the light-emitting element 4511 can be changed as appropriate in a manner that depends on the direction in which light is extracted from the light-emitting element 4511, for example.

A partition wall 4520 is formed using an organic resin film, an inorganic insulating film, or organic polysiloxane. It is particularly preferable that the partition wall 4520 be formed using a photosensitive material to have an opening over the first electrode layer 4517 so that a sidewall of the opening is formed as an inclined surface with continuous curvature.

The electroluminescent layer 4512 may be formed as a single layer or a plurality of layers stacked. A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 is formed from the same conductive film as the first electrode layer 4517 included in the light-emitting element 4511, and a terminal electrode 4516 is formed from the same conductive film as source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so that the glare is reduced can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. The present invention is not limited to the structure illustrated in FIGS. 11A and 11B.

Through the above process, a highly reliable light-emitting display panel (light-emitting panel) as a semiconductor device can be manufactured.

This embodiment can be implemented in appropriate combination with any of the structures described in the other embodiments.

Embodiment 9

A semiconductor device disclosed in this specification can be applied to electronic paper. Electronic paper can be used for electronic appliances of a variety of fields as long as they can display data. For example, electronic paper can be applied to an electronic book (electronic book) reader, a poster, an advertisement in a vehicle such as a train, or displays of various cards such as a credit card. An example of the electronic appliances is illustrated in FIG. 22.

Figure 22:
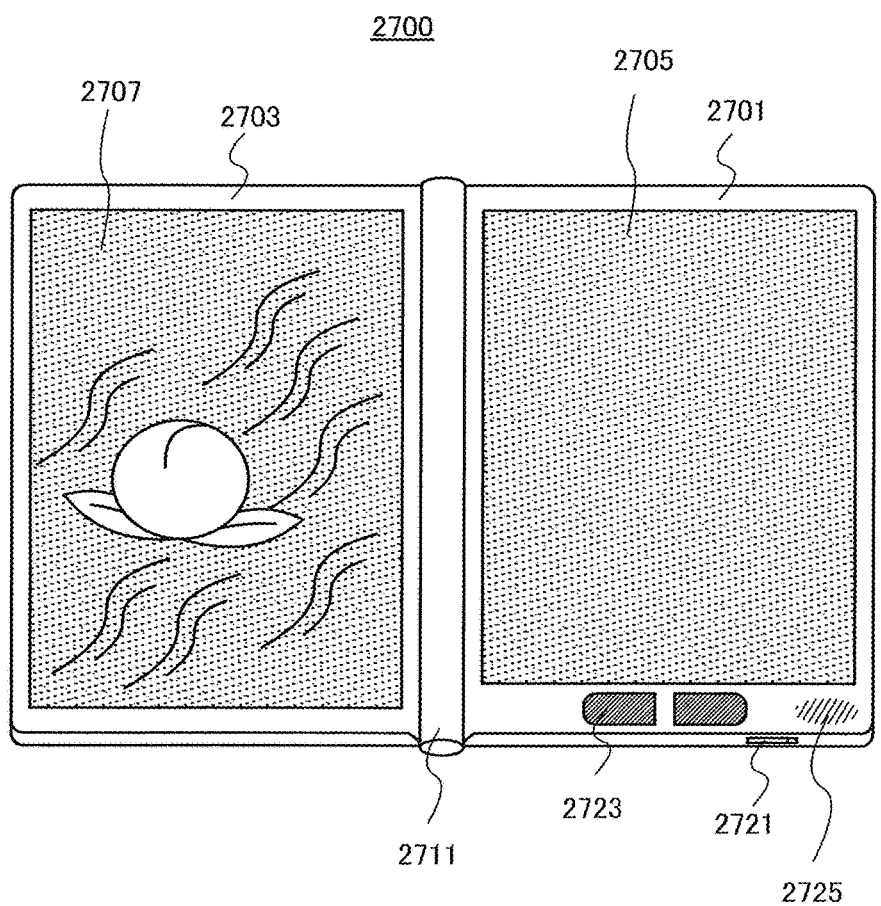
FIG. 22 is an external view illustrating an example of an electronic book reader.

FIG. 22 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 22) and images can be displayed on a display portion on the left side (the display portion 2707 in FIG. 22).

FIG. 22 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

Embodiment 10

A semiconductor device disclosed in this specification can be applied to a variety of electronic appliances (including amusement machines). Examples of electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 23A:
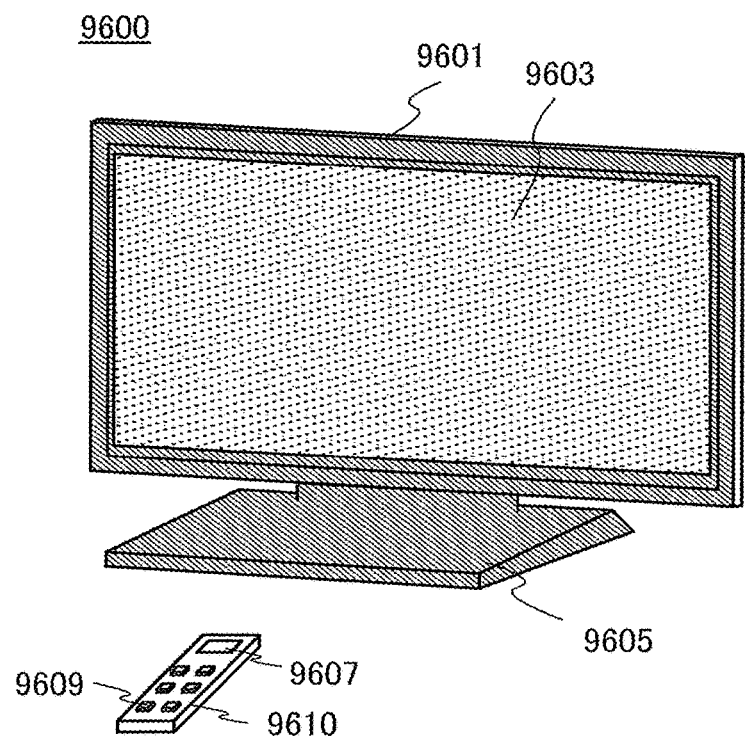
FIGS. 23A and 23B are external views illustrating examples of a television set and a digital photo frame, respectively.

FIG. 23A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 which display data outputted from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 23B:
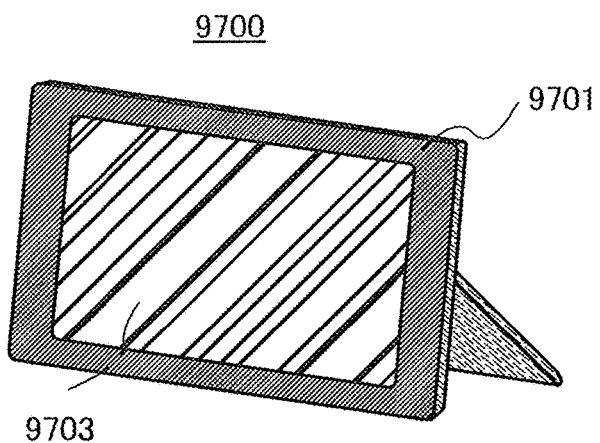

FIG. 23B illustrates an example of a digital photo frame 9700. For example, in the digital photo frame 9700, a display portion 9703 is incorporated in a housing 9701. Various images can be displayed on the display portion 9703. For example, the display portion 9703 can display image data taken with a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion 9703, it is preferable to provide them on the side surface or the back surface because the design thereof is improved. For example, a memory in which image data taken with a digital camera is stored is inserted in the recording medium insertion portion of the digital photo frame 9700, whereby the image data can be displayed on the display portion 9703.

The digital photo frame 9700 may send and receive information wirelessly. Through wireless communication, desired image data can be downloaded to be displayed.

Figure 24A:
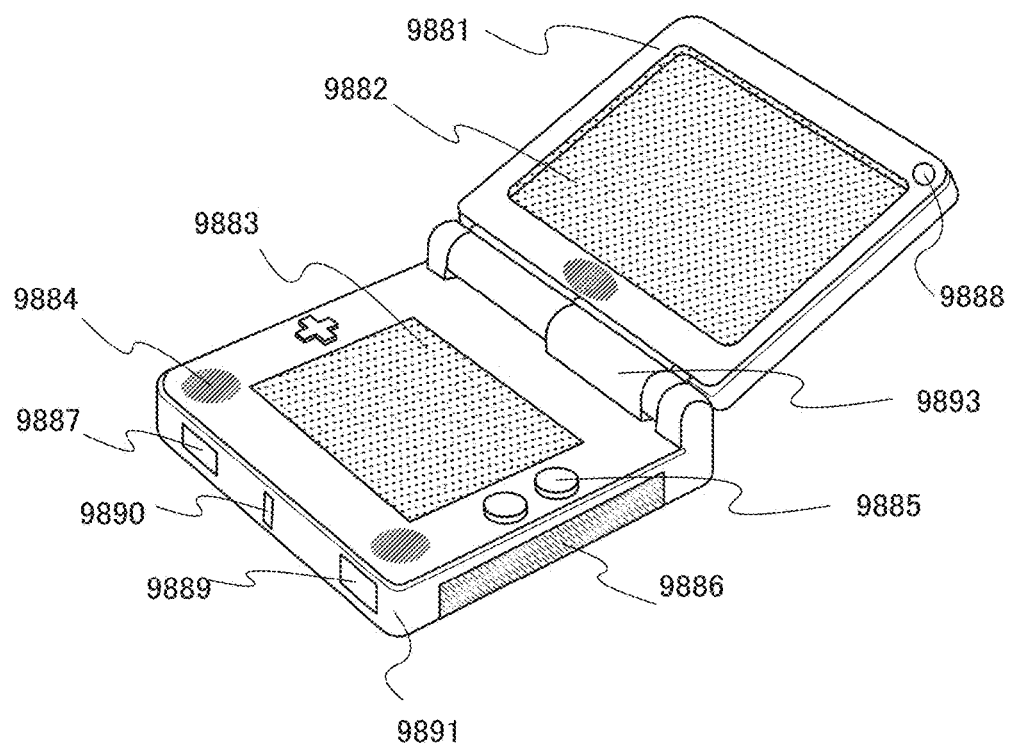
FIGS. 24A and 24B are external views illustrating examples of amusement machines.

FIG. 24A illustrates a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 24A includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above, and other structures provided with at least a semiconductor device disclosed in this specification may be employed. The portable amusement machine may include other accessory equipment as appropriate. The portable amusement machine illustrated in FIG. 24A has a function of reading a program or data stored in a recording medium to display it on the display portion, and a function of sharing information with another portable amusement machine by wireless communication. The portable amusement machine illustrated in FIG. 24A can have various functions without limitation to the above.

Figure 24B:
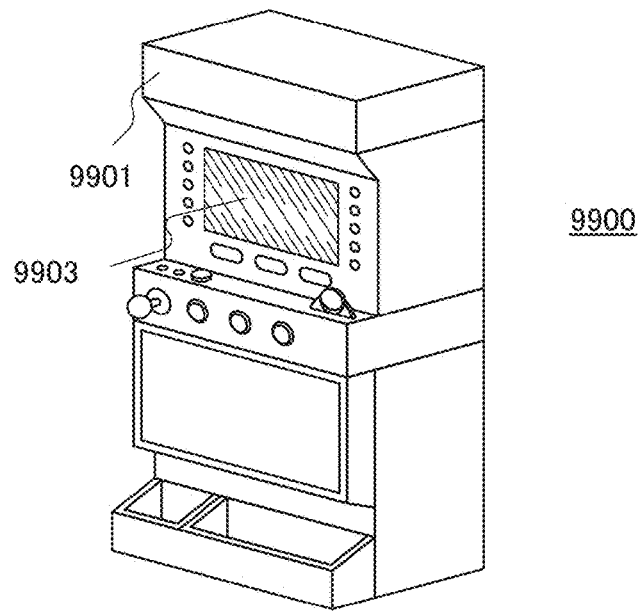

FIG. 24B illustrates an example of a slot machine 9900 which is a large-sized amusement machine. In the slot machine 9900, a display portion 9903 is incorporated in a housing 9901. In addition, the slot machine 9900 includes an operation unit such as a start lever or a stop switch, a coin slot, a speaker, and the like. It is needless to say that the structure of the slot machine 9900 is not limited to the above, and other structures provided with at least a semiconductor device disclosed in this specification may be employed. The slot machine 9900 may include other accessory equipment as appropriate.

Figure 25A:
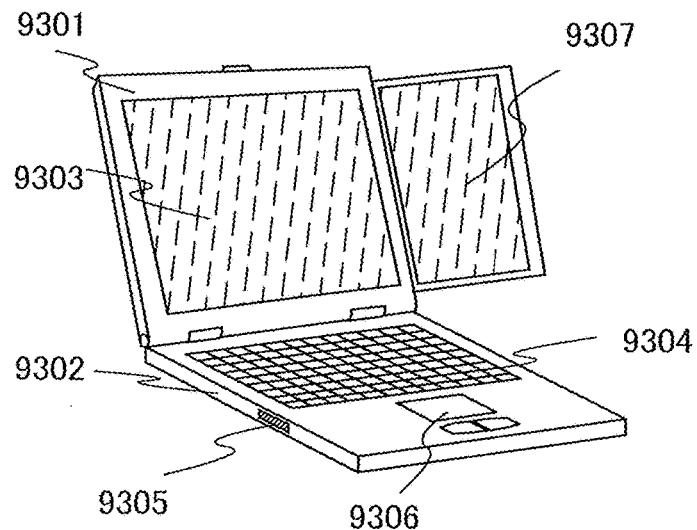
FIGS. 25A and 25B are external views respectively illustrating an example of a portable computer and an example of a cellular phone.

FIG. 25A is a perspective view illustrating an example of a portable computer.

In the portable computer in FIG. 25A, a top housing 9301 having a display portion 9303 and a bottom housing 9302 having a keyboard 9304 can overlap with each other by closing a hinge unit which connects the top housing 9301 and the bottom housing 9302. The portable computer in FIG. 25A can be convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device of a liquid crystal display panel, a light-emitting display panel such as an organic light-emitting element or an inorganic light-emitting element, or the like.

In addition, the portable computer in FIG. 25A, which can be provided with a receiver and the like, can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit which displays the television broadcast is performed. Therefore, power consumption can be minimized, which is advantageous for the portable computer whose battery capacity is limited.

Figure 25B:
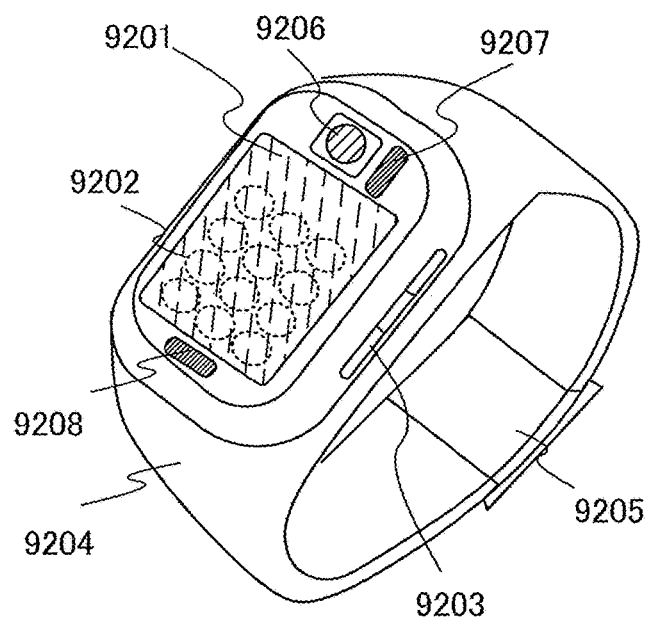

FIG. 25B is a perspective view illustrating an example of a cellular phone that the user can wear on the wrist like a wristwatch.

This cellular phone includes a main body which includes a battery and a communication device having at least a telephone function; a band portion 9204 which enables the main body to be wore on the wrist; an adjusting portion 9205 which adjusts the band portion 9204 to fit the wrist; a display portion 9201; a speaker 9207; and a microphone 9208.

In addition, the main body includes an operation switch 9203. The operation switch 9203 serves, for example, as a switch for starting a program for the Internet when the switch is pushed, in addition to serving as a switch for turning on a power source, a switch for shifting a display, a switch for instructing to start taking images, or the like, and can be used so as to correspond to each function.

Input to this cellular phone is operated by touching the display portion 9201 with a finger, an input pen, or the like, by operating the operation switch 9203, or by inputting voice into the microphone 9208. Note that displayed buttons 9202 which are displayed on the display portion 9201 are illustrated in FIG. 25B. Input can be performed by touching the displayed buttons 9202 with a finger or the like.

Further, the main body includes a camera portion 9206 including an image pick-up unit having a function of converting an image of an object, which is formed through a camera lens, to an electronic image signal. Note that the camera portion is not necessarily provided.

The cellular phone illustrated in FIG. 25B, which can be provided with a receiver of a television broadcast and the like, can display an image on the display portion 9201 by receiving a television broadcast. In addition, the cellular phone illustrated in FIG. 25B may be provided with a storage device and the like such as a memory, and thus can record a television broadcast in the memory. The cellular phone illustrated in FIG. 25B may have a function of collecting location information, such as the GPS.

The display portion 9201 is formed using an image display device of a liquid crystal display panel, a light-emitting display panel such as an organic light-emitting element or an inorganic light-emitting element, or the like. The cellular phone illustrated in FIG. 25B is compact and lightweight and thus has limited battery capacity. Therefore, a panel which can be driven with low power consumption is preferably used as a display device for the display portion 9201.

Note that FIG. 25B illustrates the electronic appliance which is worn on the wrist; however, this embodiment is not limited thereto as long as a portable shape is employed.

Example 1

In this example, in an oxide semiconductor layer including a region having high oxygen density and a region having low oxygen density, the simulation result thereof in change of the oxygen density before and after heat treatment will be described with reference to FIG. 34 and FIG. 21. As software for the simulation, Materials Explorer 5.0 manufactured by Fujitsu Limited was used.

Figure 34:
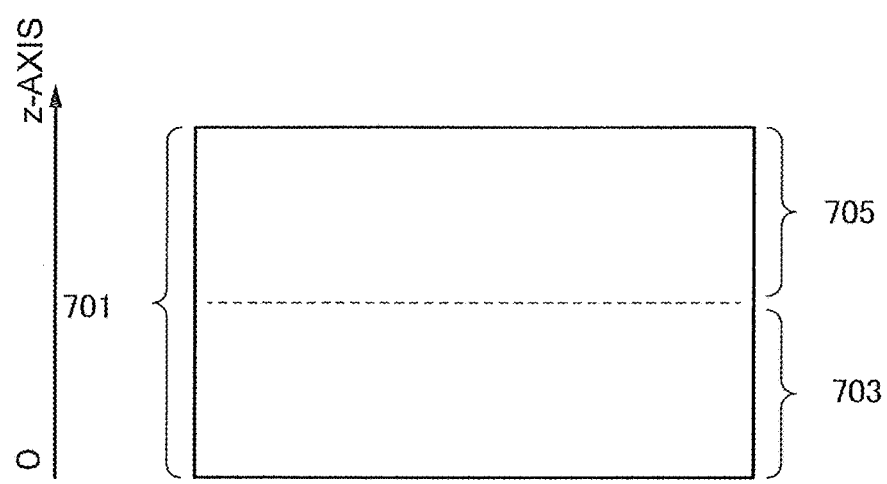
FIG. 34 illustrates a structure of an oxide semiconductor layer used for simulation.

FIG. 34 illustrates a model of an oxide semiconductor layer which was used for the simulation. Here, a structure in which a layer 703 having low oxygen density and a layer 705 having high oxygen density were stacked was employed for an oxide semiconductor layer 701.

For the layer 703 having low oxygen density, an amorphous structure was employed in which the numbers of In atoms, Ga atoms, and Zn atoms were each 15 and the number of O atoms was 54.

In addition, for the layer 705 having high oxygen density, an amorphous structure was employed in which the numbers of In atoms, Ga atoms, and Zn atoms were each 15 and the number of O atoms was 66.

Moreover, the density of the oxide semiconductor layer 701 was set at 5.9 g/cm$^3$.

Next, the classical molecular dynamics (MD) simulation was performed on the oxide semiconductor layer 701 under conditions of NVT ensemble and a temperature of 250° C. The time step was set at 0.2 fs, and the total simulation time was set at 200 ps. In addition, Born-Mayer-Huggins potential was used for the potentials of metal-oxygen bonding and oxygen-oxygen bonding. Moreover, movement of atoms at an upper end portion and a lower end portion of the oxide semiconductor layer 701 was fixed.

Figure 21:
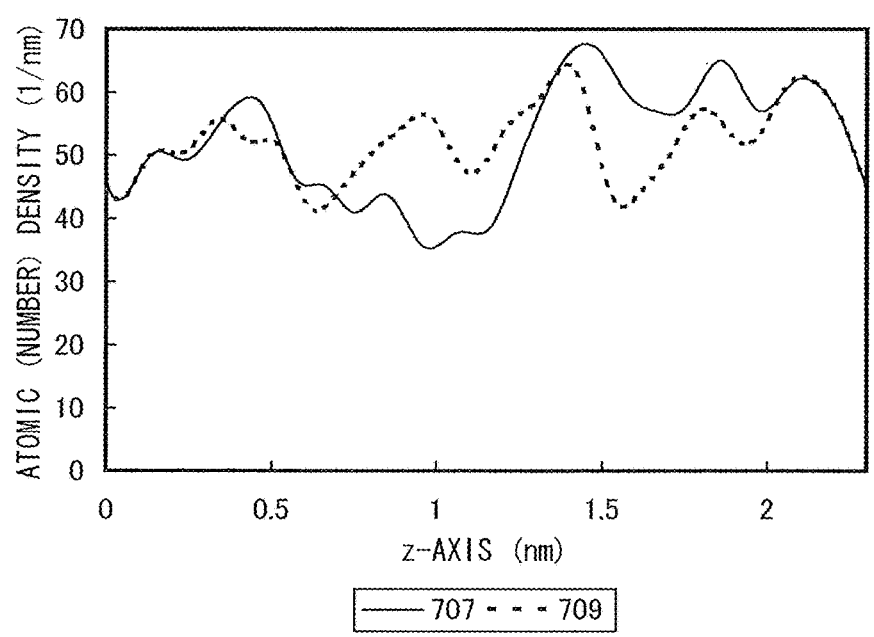
FIG. 21 shows simulation results of oxygen density of an oxide semiconductor layer.

Then, the simulation result is shown in FIG. 21. In z-axis coordinates, the range of 0 nm to 1.15 nm indicates the layer 703 having low oxygen density, and the range of 1.15 nm to 2.3 nm indicates the layer 705 having high oxygen density. The distribution of oxygen densities before the MD simulation is indicated by a solid line 707, and the distribution of oxygen densities after the MD simulation is indicated by a dashed line 709.

The solid line 707 shows that the oxide semiconductor layer 701 has higher oxygen densities in a region raging from the interface between the layer 703 having low oxygen density and the layer 705 having high oxygen density to the layer 705 having high oxygen density. On the other hand, in the dashed line 709, it is found that the oxygen densities are uniform in the layer 703 having low oxygen density and the layer 705 having high oxygen density.

As described above, when there is non-uniformity in the density of oxygen densities as in the stack of the layer 703 having low oxygen density and the layer 705 having high oxygen density, it is found that the oxygen diffuses from where an oxygen density is higher to where an oxygen density is lower by heat treatment and thus the oxygen densities become uniform.

That is, as described in Embodiment 1, since the oxygen density at the interface between the first oxide semiconductor layer 432 and the oxide insulating film 407 is increased by formation of the oxide insulating film 407 over the first oxide semiconductor layer 432, the oxygen diffuses to the first oxide semiconductor layer 432 where the oxygen density is low and thus the first oxide semiconductor layer 432 has higher resistance. As described above, reliability of a thin film transistor can be improved.

The present application is based on Japanese Patent Application serial No. 2009-156414 filed with Japan Patent Office on Jun. 30, 2009, the entire contents of which are hereby incorporated by reference.

The invention claimed is:
1. A semiconductor device comprising:
a first conductive film over a substrate;
a first insulating film over the first conductive film;
a first oxide semiconductor film over the first insulating film;
a second oxide semiconductor film over the first oxide semiconductor film;
a second conductive film and a third conductive film over the first oxide semiconductor film and the second oxide semiconductor film;
an oxide insulating film over the second conductive film and the third conductive film; and
a fourth conductive film over the oxide insulating film,
wherein the oxide insulating film is in contact with part of the first oxide semiconductor film and part of the second oxide semiconductor film,
wherein the fourth conductive film overlaps the first conductive film, the first oxide semiconductor film and the second oxide semiconductor film, and
wherein the first conductive film and the fourth conductive film are configured to be supplied with a same potential.

2. The semiconductor device according to claim 1,
wherein the first oxide semiconductor film comprises a region which has a carrier density of less than $1 \times 10^{18}$/cm$^3$.

3. The semiconductor device according to claim 1,
wherein the second oxide semiconductor film comprises a nanocrystal.

4. The semiconductor device according to claim 1,
wherein each of the second conductive film and the third conductive film has a stacked structure comprising a film containing copper.

5. The semiconductor device according to claim 1,
wherein the fourth conductive film comprises a transparent conductive film.

6. The semiconductor device according to claim 1,
wherein the first oxide semiconductor film is thicker than the second oxide semiconductor film.

7. The semiconductor device according to claim 1,
wherein at least one of the first oxide semiconductor film and the second oxide semiconductor film comprises indium, gallium, and zinc.

8. The semiconductor device according to claim 1,
wherein at least one of the first oxide semiconductor film and the second oxide semiconductor film comprises indium, tin, and zinc.

9. The semiconductor device according to claim 1,
wherein at least one of the first oxide semiconductor film and the second oxide semiconductor film comprises indium, aluminum, and zinc.

10. The semiconductor device according to claim 1,
wherein at least one of the first oxide semiconductor film and the second oxide semiconductor film comprises tin and zinc.

11. The semiconductor device according to claim 1,
wherein at least one of the first oxide semiconductor film and the second oxide semiconductor film comprises tin, gallium, and zinc.

12. The semiconductor device according to claim 1,
wherein at least one of the first oxide semiconductor film and the second oxide semiconductor film comprises tin, aluminum, and zinc.

13. An electronic device comprising the semiconductor device according to claim 1.

* * * * *